US009429279B2

(12) United States Patent
Dowling et al.

(10) Patent No.: US 9,429,279 B2
(45) Date of Patent: Aug. 30, 2016

(54) INTEGRATED LED-BASED LUMINAIRE FOR GENERAL LIGHTING

(71) Applicant: Koninklijke Philips Electronics N.V., Eindhoven (NL)

(72) Inventors: Kevin J. Dowling, Westford, MA (US); Ihor A. Lys, La Jolla, CA (US); Ryan C. Williamson, Somerville, MA (US); Brian Roberge, Franklin, MA (US); Ron Roberts, Melrose, MA (US); Frederick Morgan, Canton, MA (US); Michael Jay Datta, Brookline, MA (US); Tomas Jonathan Mollnow, Indian Rocks Beach, MA (US)

(73) Assignee: PHILIPS SOLID-STATE LIGHTING SOLUTIONS, INC., Burlington, MA (US)

( * ) Notice: Subject to any disclaimer, the term of this patent is extended or adjusted under 35 U.S.C. 154(b) by 187 days.

(21) Appl. No.: 13/757,919

(22) Filed: Feb. 4, 2013

(65) Prior Publication Data
US 2014/0192527 A1   Jul. 10, 2014

Related U.S. Application Data

(62) Division of application No. 12/681,950, filed as application No. PCT/US2008/079208 on Oct. 8, 2008, now Pat. No. 8,390,207.

(60) Provisional application No. 60/978,612, filed on Oct. 9, 2007.

(51) Int. Cl.
*F21V 9/00* (2015.01)
*F21K 99/00* (2016.01)
*H05B 33/08* (2006.01)

(52) U.S. Cl.
CPC ............. *F21K 9/50* (2013.01); *H05B 33/0818* (2013.01); *H05B 33/0857* (2013.01); *H01L 2224/48091* (2013.01); *H01L 2224/48227* (2013.01); *Y02B 20/347* (2013.01)

(58) Field of Classification Search
CPC ............ F21K 9/50; F21K 9/00; F21K 9/135; F21K 9/137; F21V 1/00; H05B 33/0818; H05B 33/0857; Y02B 20/347
USPC ....... 362/231, 237, 240, 241, 245, 329, 236; 359/718
See application file for complete search history.

(56) References Cited

U.S. PATENT DOCUMENTS 6,149,283 A  * 11/2000  Conway et al. ............... 362/236
6,814,470 B2 * 11/2004  Rizkin et al. ................. 362/327

(Continued)

FOREIGN PATENT DOCUMENTS

DE   202007003679 U1   6/2007
EP      1662583 A1     5/2006

(Continued)

OTHER PUBLICATIONS

Adragna, C.: ST Microelectonics Application Note AN966, "L6561 Enhanced Transition Mode Power Factor Corrector", Mar. 2003.

(Continued)

*Primary Examiner* — Anh Mai
*Assistant Examiner* — Glenn Zimmerman

(57) ABSTRACT

Lighting apparatus and methods employing LED light sources are described. The LED light sources are integrated with other components in the form of a luminaire or other general purpose lighting structure. Some of the lighting structures are formed as Parabolic Aluminum Reflector (PAR) luminaires, allowing them to be inserted into conventional sockets. The lighting structures display beneficial operating characteristics, such as efficient operation, high thermal dissipation, high output, and good color mixing.

13 Claims, 28 Drawing Sheets

(56) References Cited

U.S. PATENT DOCUMENTS

| | | | |
|---|---|---|---|
| 6,948,829 B2 * | 9/2005 | Verdes et al. | 362/227 |
| 6,982,518 B2 * | 1/2006 | Chou et al. | 313/46 |
| 7,053,540 B2 * | 5/2006 | Bobel | 313/318.1 |
| 7,144,135 B2 * | 12/2006 | Martin et al. | 362/294 |
| 7,193,365 B2 * | 3/2007 | Ishizaka | 313/512 |
| 7,233,115 B2 | 6/2007 | Lys | |
| 7,256,554 B2 | 8/2007 | Lys | |
| 7,524,089 B2 * | 4/2009 | Park | 362/294 |
| 7,549,774 B2 * | 6/2009 | Tsai | 362/294 |
| 7,748,870 B2 * | 7/2010 | Chang et al. | 362/294 |
| 2002/0190262 A1 * | 12/2002 | Nitta | H01L 25/0753 257/99 |
| 2003/0008431 A1 * | 1/2003 | Matsubara | H01L 33/28 438/98 |
| 2003/0137838 A1 * | 7/2003 | Rizkin et al. | 362/240 |
| 2003/0189830 A1 * | 10/2003 | Sugimoto | H01L 25/0753 362/294 |
| 2005/0073244 A1 * | 4/2005 | Chou et al. | 313/498 |
| 2005/0111234 A1 * | 5/2005 | Martin et al. | 362/555 |
| 2006/0038803 A1 | 2/2006 | Miller et al. | |
| 2006/0102914 A1 * | 5/2006 | Smits | H01L 33/54 257/98 |
| 2006/0198147 A1 * | 9/2006 | Ge | 362/294 |
| 2006/0226437 A1 * | 10/2006 | Fujita | H01L 33/60 257/98 |
| 2007/0086199 A1 * | 4/2007 | Demarest et al. | 362/441 |
| 2008/0157112 A1 | 7/2008 | He et al. | |
| 2008/0165535 A1 * | 7/2008 | Mazzochette | F21S 8/026 362/294 |
| 2008/0219001 A1 * | 9/2008 | Russell | F21K 9/135 362/246 |
| 2008/0258695 A1 * | 10/2008 | Kumar | H05B 33/0818 323/223 |
| 2008/0278092 A1 | 11/2008 | Lys et al. | |
| 2008/0308825 A1 * | 12/2008 | Chakraborty | H01L 33/56 257/98 |
| 2008/0310158 A1 | 12/2008 | Harbers et al. | |
| 2009/0174342 A1 | 7/2009 | Maxik | |
| 2009/0283779 A1 * | 11/2009 | Negley | F21K 9/00 257/88 |
| 2011/0051394 A1 * | 3/2011 | Bailey | F21K 9/00 362/84 |
| 2013/0134456 A1 * | 5/2013 | Lu | F21V 5/002 257/89 |

FOREIGN PATENT DOCUMENTS

| | | |
|---|---|---|
| EP | 1914470 A1 | 4/2008 |
| JP | 3129417 A | 6/1991 |
| RU | 2359362 C2 | 6/2009 |
| WO | 2006068359 A1 | 6/2006 |
| WO | 2007036871 A2 | 4/2007 |

OTHER PUBLICATIONS

Salati, L. ST Microelectonics Application Note AN1757, "Switching From TEH L6561 to the L6562", Apr. 2004.

Adragna, C. et al., ST Microelectronics Application Note AN1060, "Flyback Converters With the L6561 PFC Controller", Jan. 2003.

Adragna, C., ST Microelectronics Application Note AN1059, "Design Equations of High-Power-Factor Flyback Converters Based on the L6561", Sep. 2003.

Adragna, C., ST Microelectronics Application Note AN1007, "I6561-Based Switcher Replaces MAG AMPS in Silver Boxes", Oct. 2003.

Adragna, C., ST Microelectronics Application Note AN1792, "Design of Fixed-Off-Time Controlled PFC Pre-Regulators With the L6562", Nov. 2003.

* cited by examiner

Section A-A

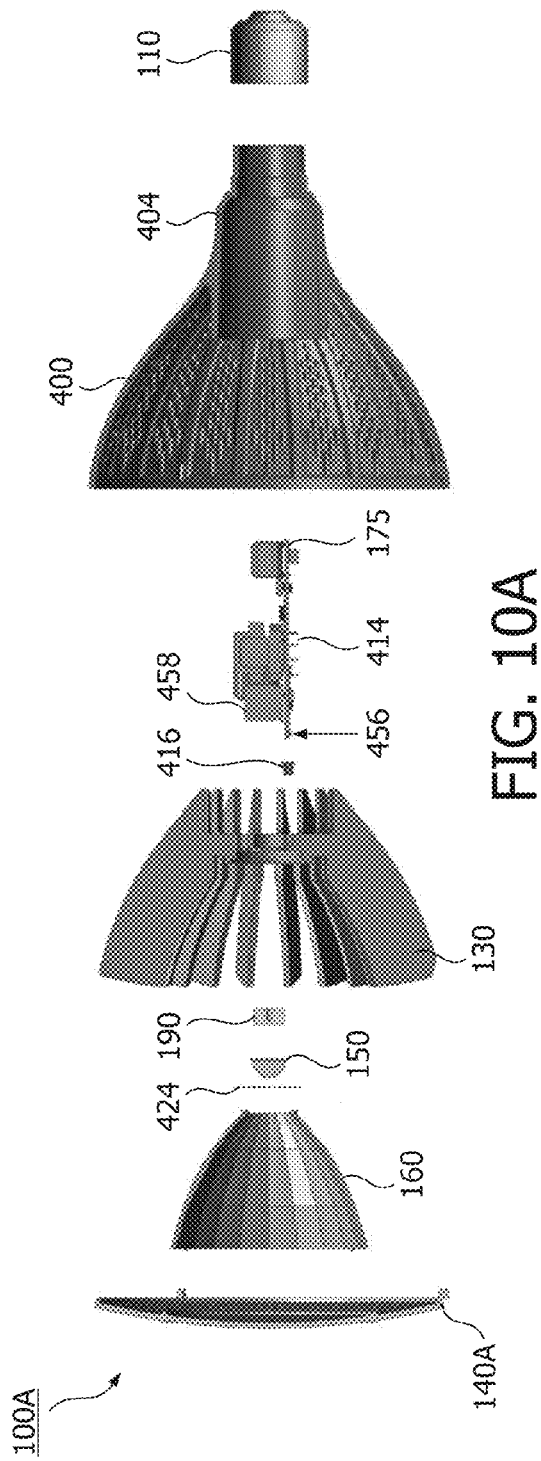
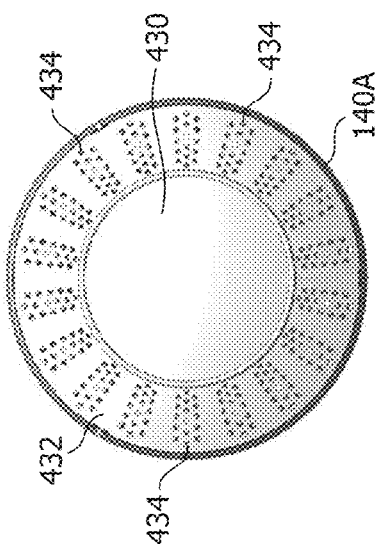
FIG. 10A
FIG. 10B

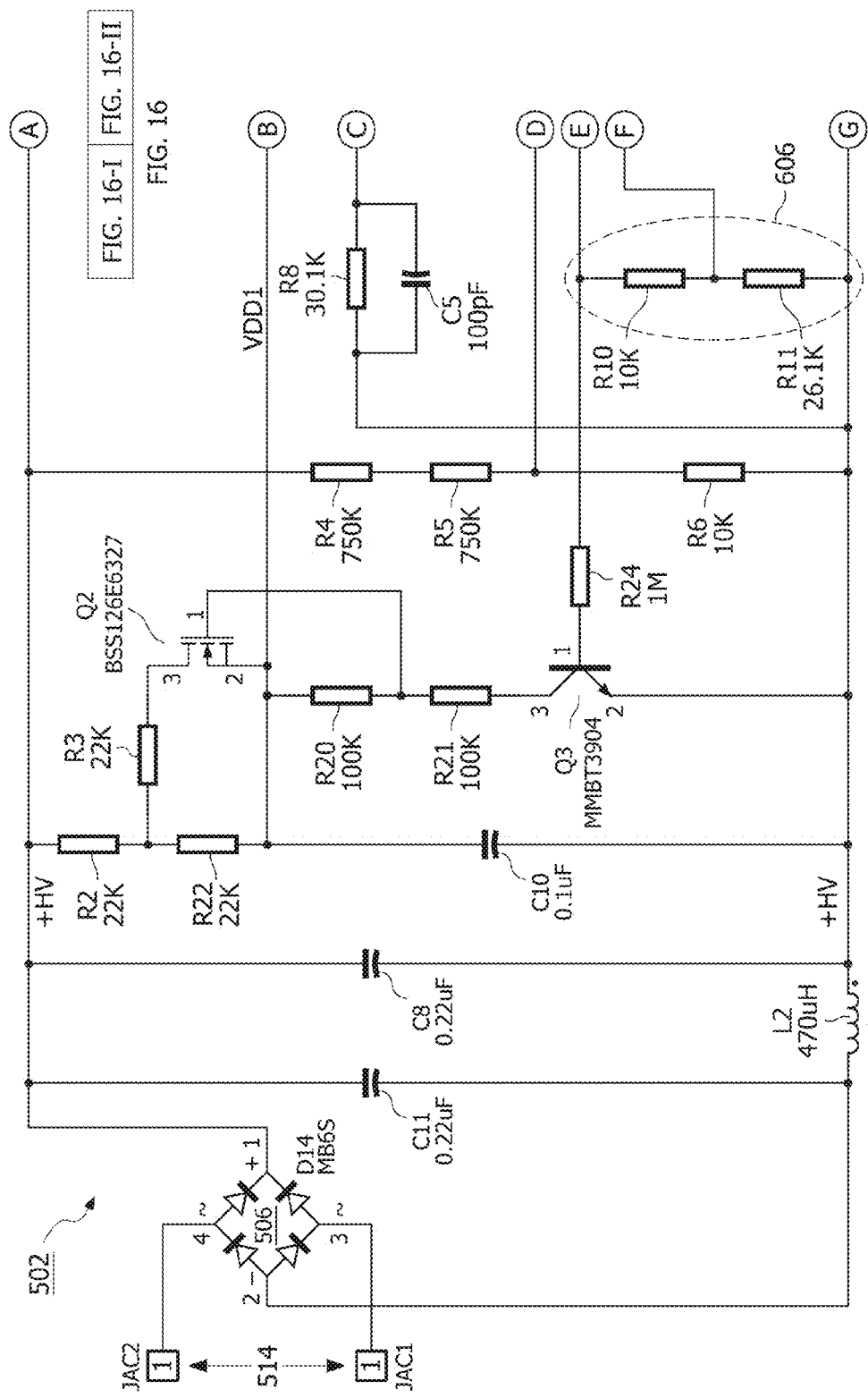
FIG. 16-I

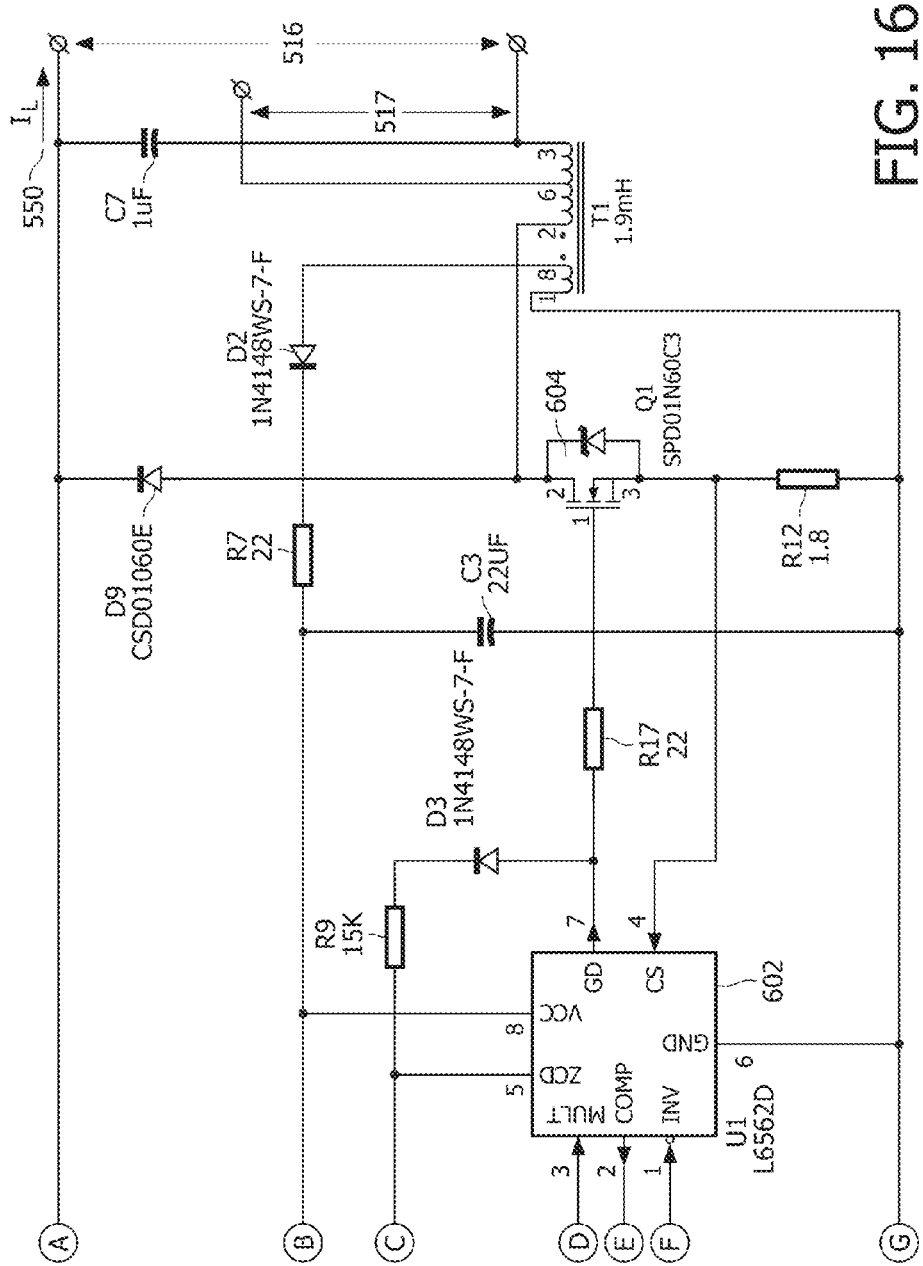
FIG. 16-II

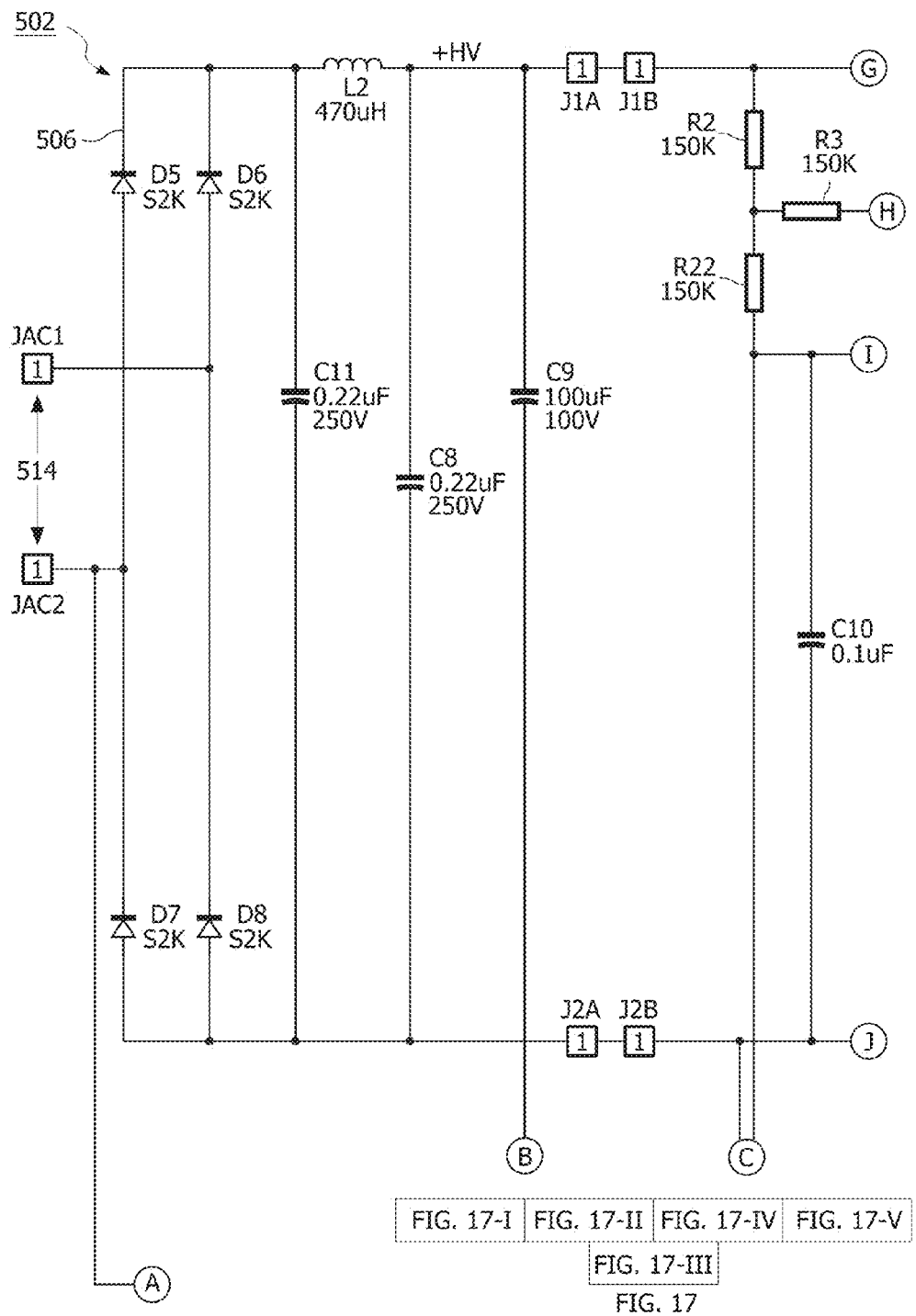
FIG. 17-I

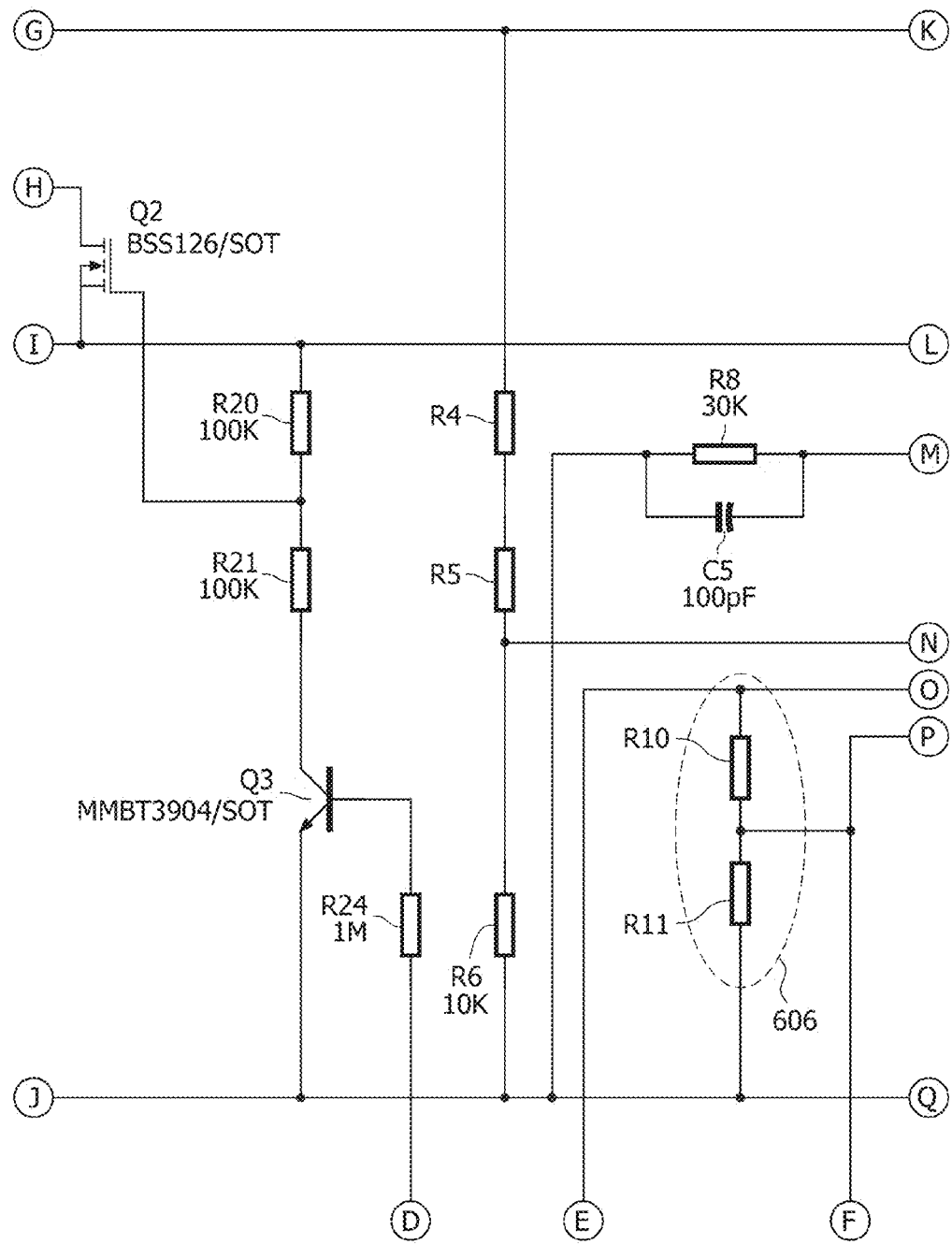
FIG. 17-II

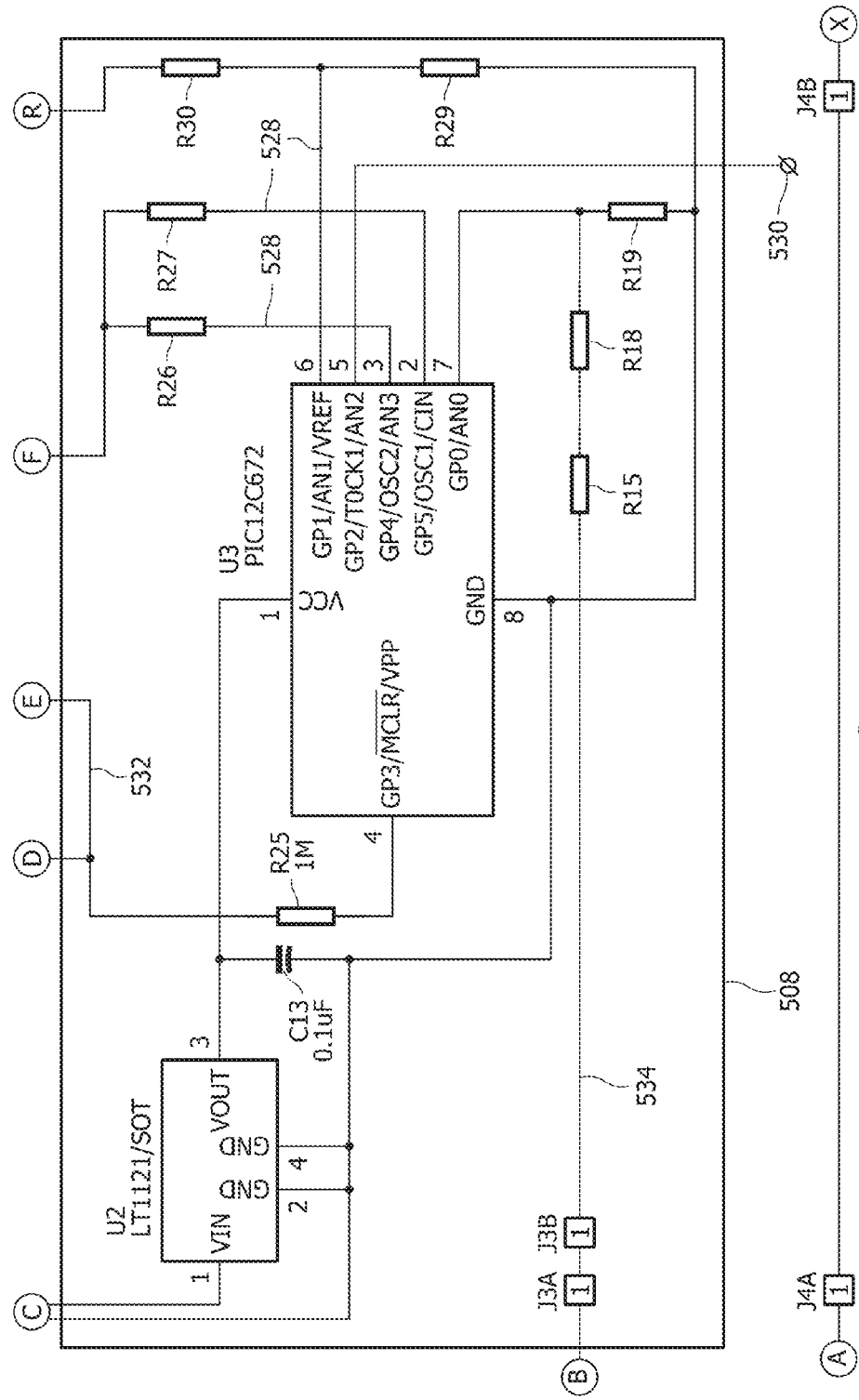
FIG. 17-III

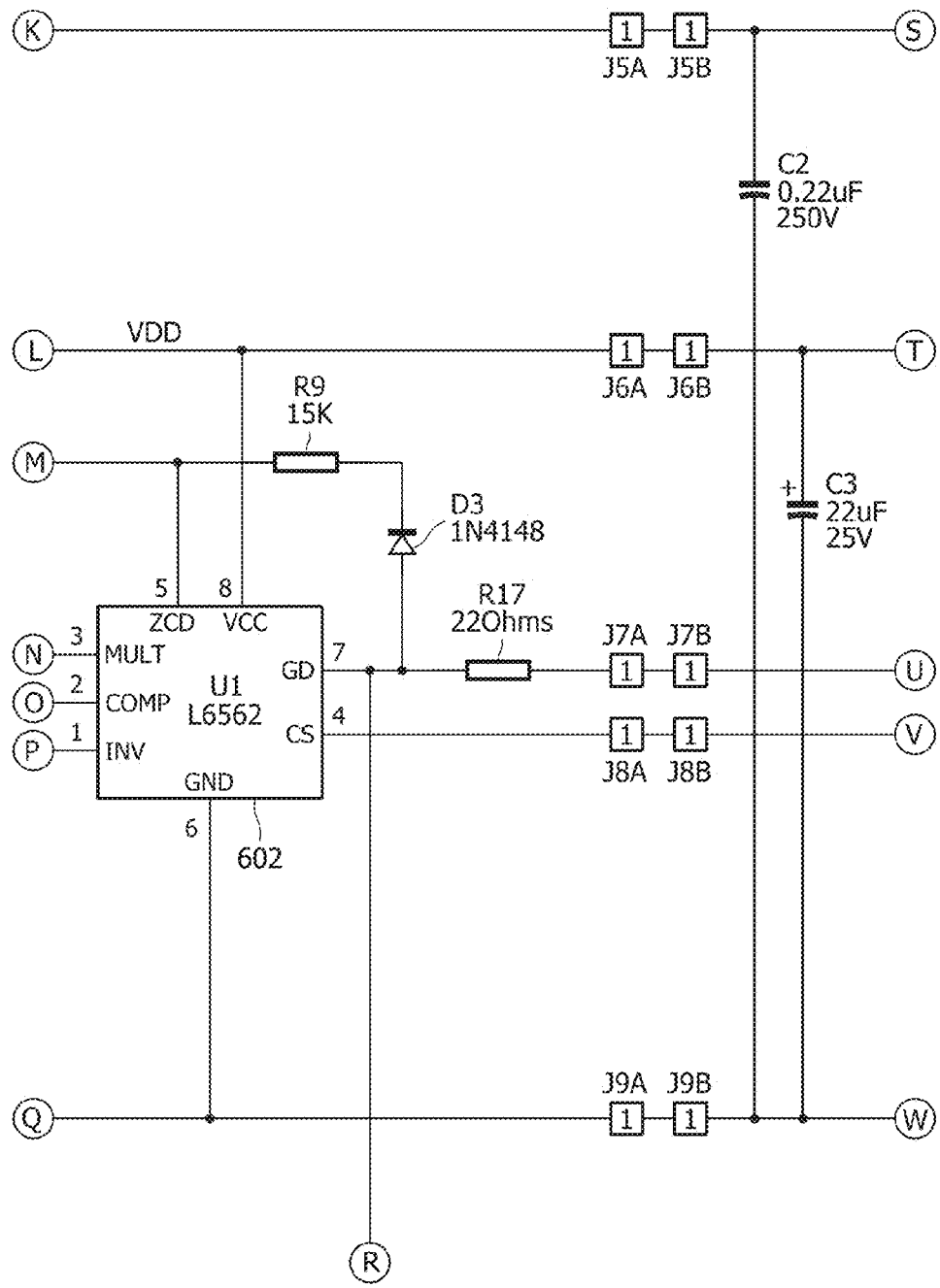
FIG. 17-IV

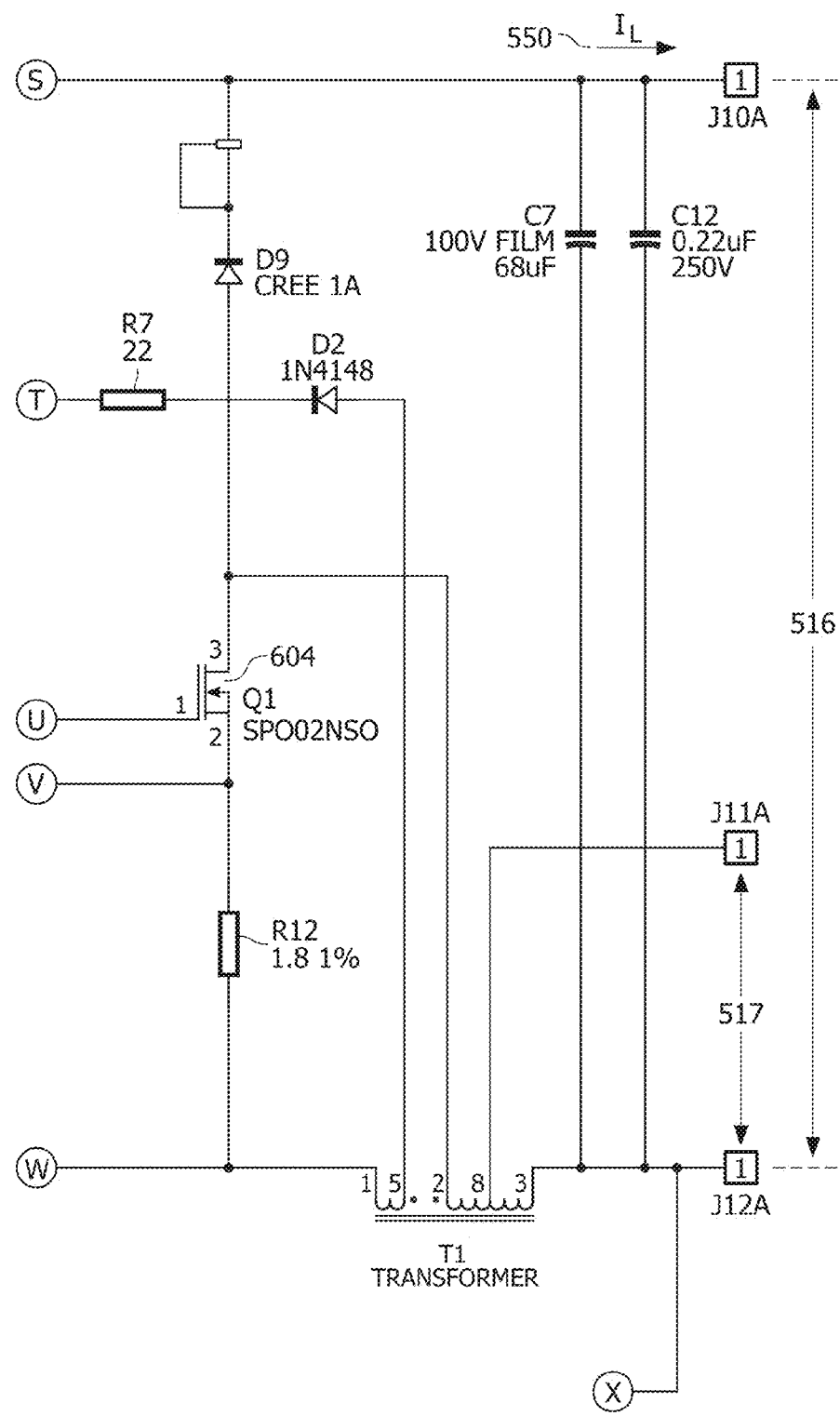
FIG. 17-V

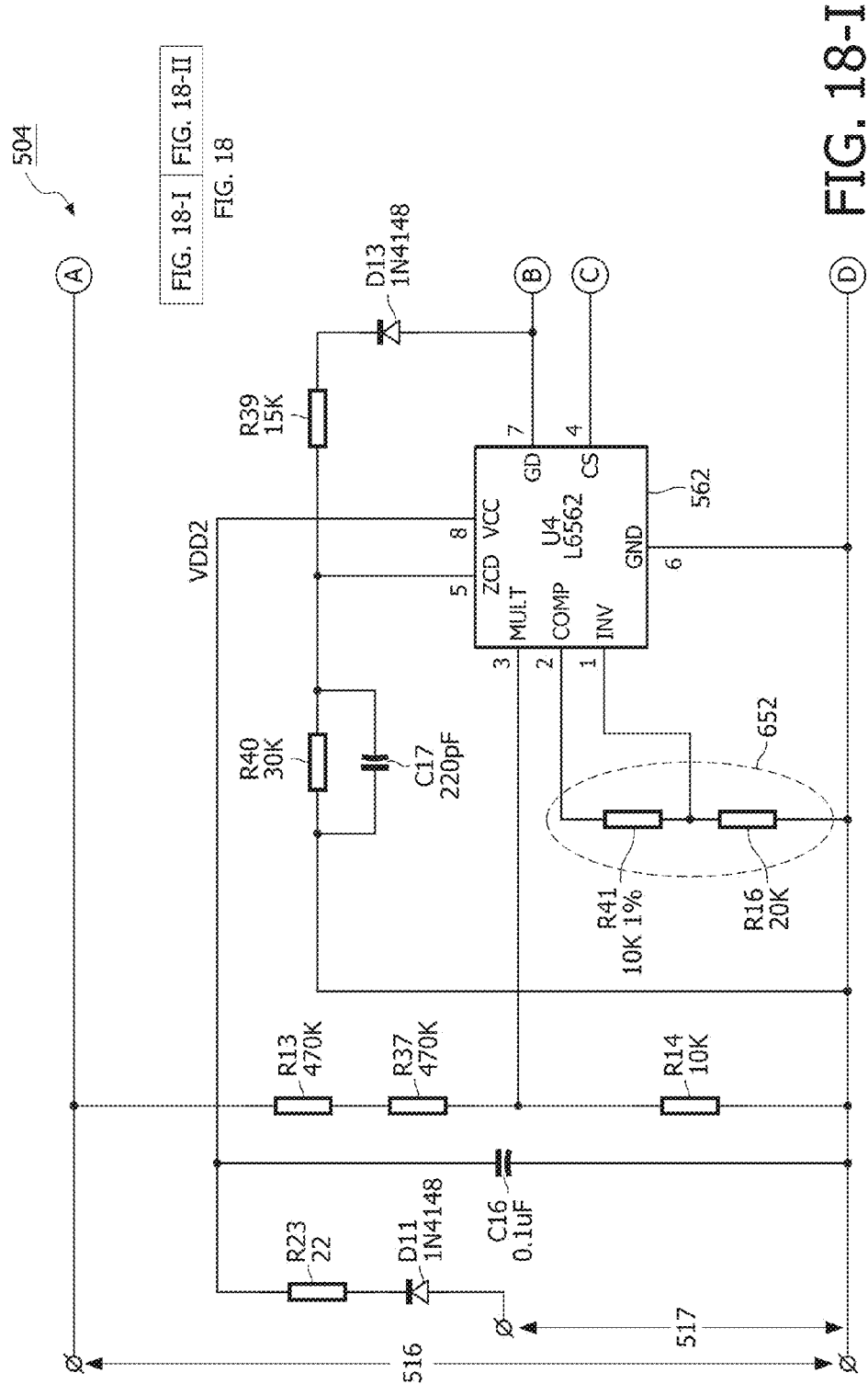

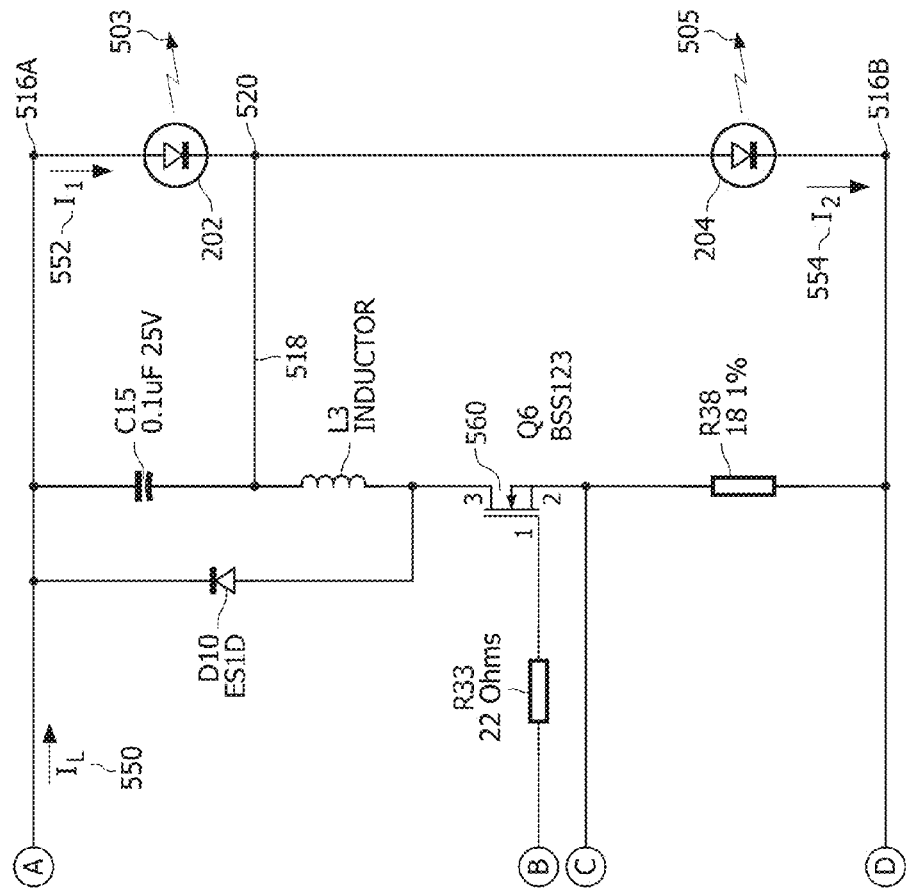
FIG. 18-II

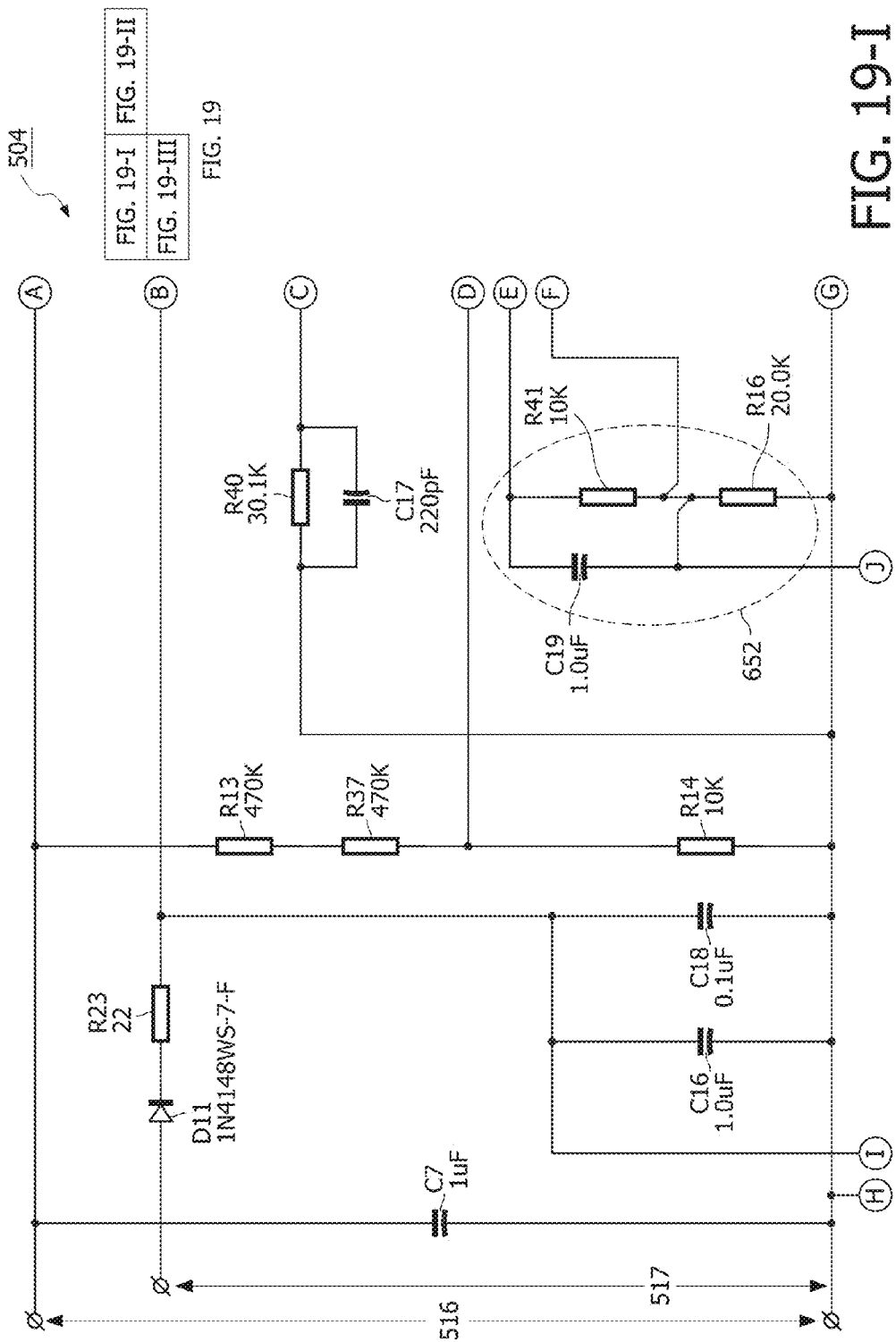
FIG. 19-I

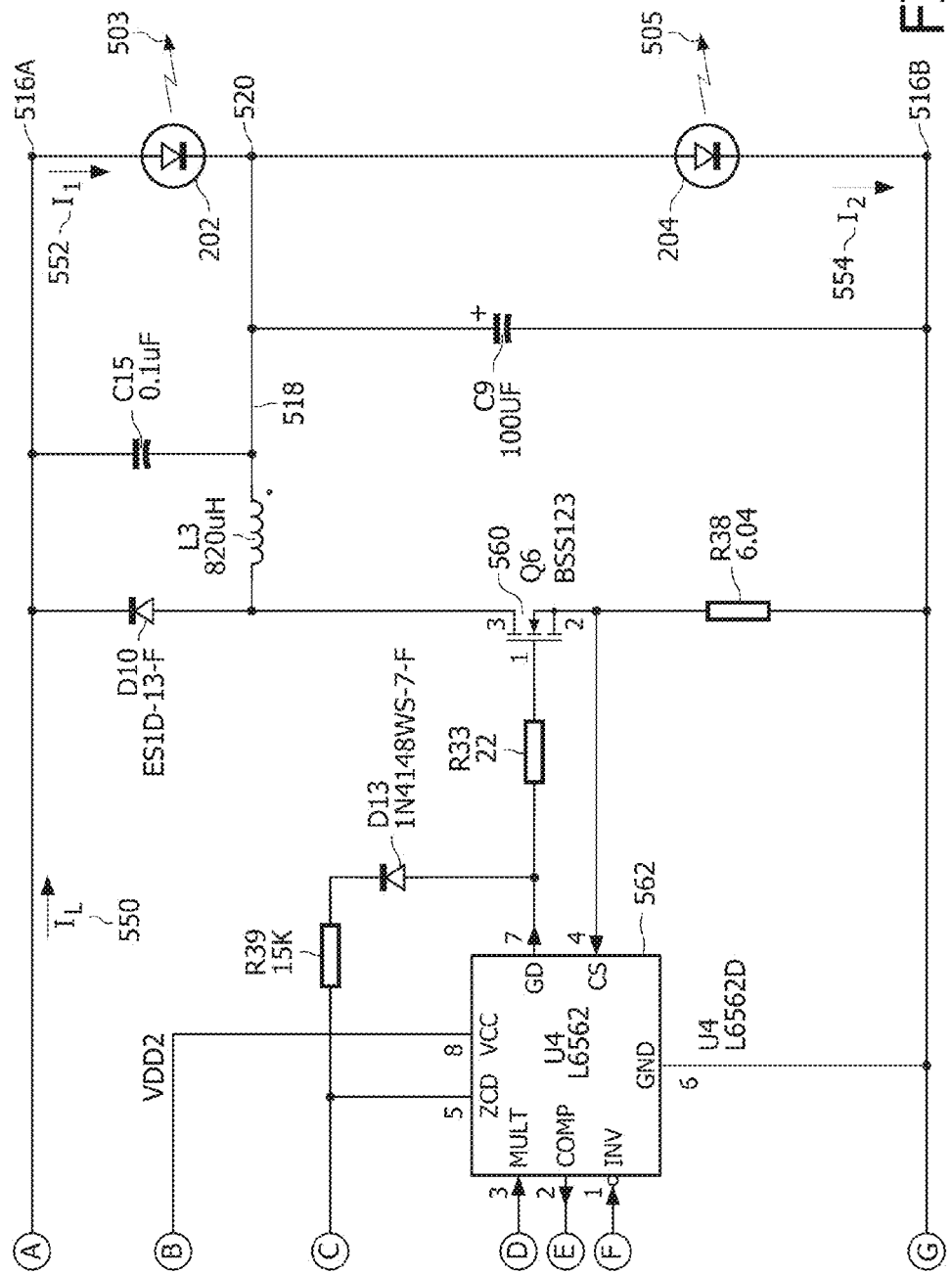
FIG. 19-II

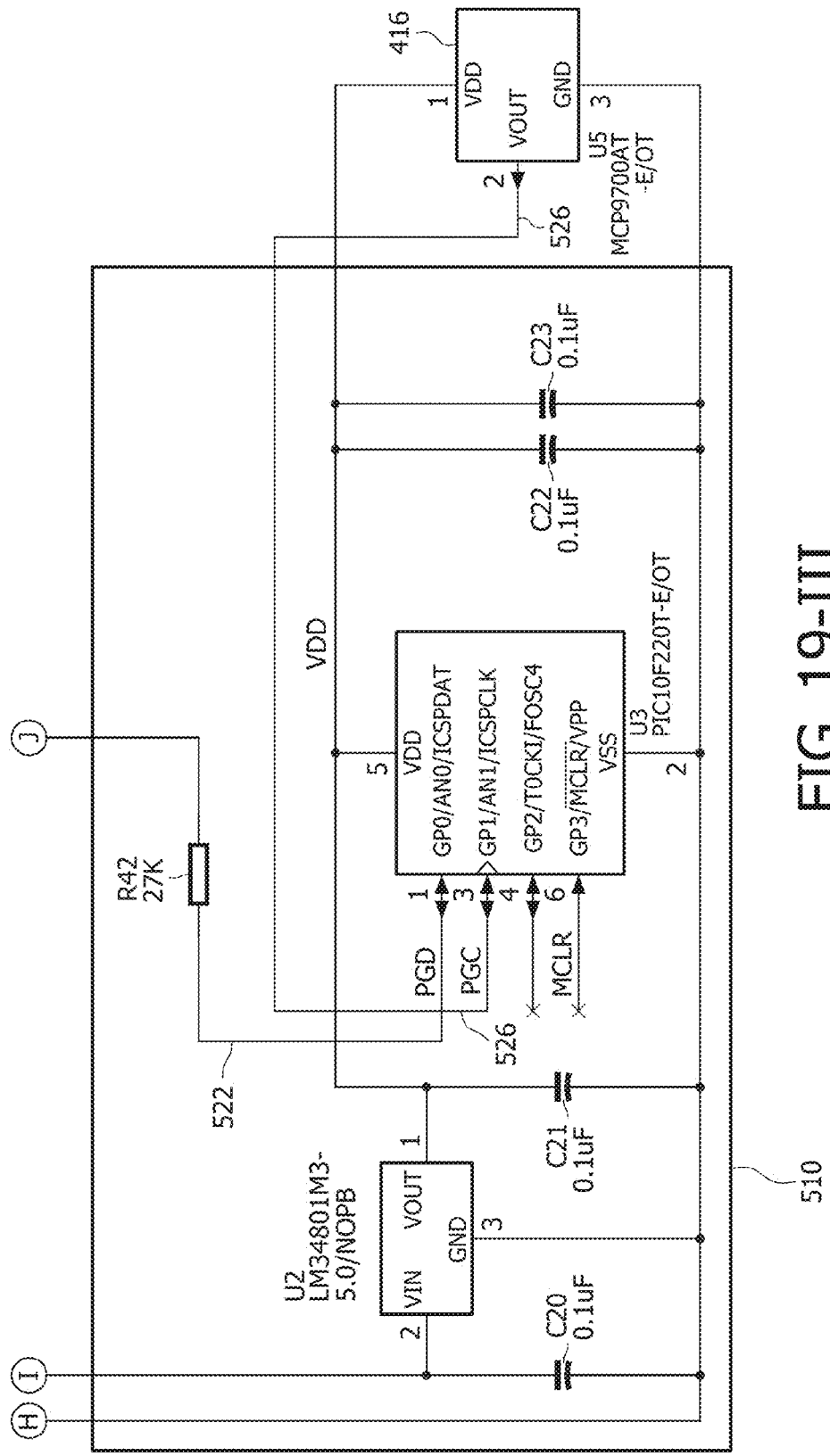
FIG. 19-III

INTEGRATED LED-BASED LUMINAIRE FOR GENERAL LIGHTING

STATEMENT OF GOVERNMENTAL INTEREST

This invention was made with governmental support under grant number DE-DE-FC26-06NT42932 awarded by the U.S. Department of Energy. The U.S. Government has certain rights in the invention.

BACKGROUND

Sealed beam lamps are ubiquitous and used in a variety of lighting applications. They are employed, for example, as automobile headlights, theatrical lights, outdoor architectural lights, aircraft landing lights, and spot lights. A "sealed beam" lamp is a type of lamp that includes a reflector and filament manufactured as a single assembly, over which a front cover or lens, usually of clear glass, is permanently attached. Popular sizes of sealed beam lamps are the PAR56, PAR38, and PAR30, where the "PAR" is an acronym for Parabolic Aluminum Reflector. The PAR has come to be accepted as a non-SI unit of measurement equal to one-eighth of an inch. For example, a PAR38 light bulb is a light bulb having a diameter equal to 4.75 inches. Common light beam spreads for sealed beam lamps are flood, spot, narrow spot, or very narrow spot beams.

Spot lights are found in various retail, residential, and architectural settings everyday. For example, virtually all supermarkets, convenience stores, drug stores, department stores, jewelry stores, discount stores, motor vehicle dealers, and specialty apparel stores use spot lighting. Conventional light sources typically employed in spot lighting applications, however, suffer from a number of drawbacks.

In particular, fluorescent light sources, although often efficient and inexpensive, are too diffuse to be effective for spot lighting. In other words, these sources are poorly suited for applications requiring directed light. In addition to poor light output distribution, color temperatures of these sources are not well-suited for many applications. Further, although halogen lamps tend to have low upfront costs, good color rendition and good beam control, they are typically quite inefficient for spot light applications, having light output efficiencies in the range of just 10-20 lumens/watt. Another type of lamp typically used for spot lighting is the ceramic metal halide ("CMH") lamp. While CMH lamps can offer good beam control and energy efficiency, they typically have high initial costs and can be too bright and non-dimmable, making adjacent areas often look dark by comparison. Finally, traditional incandescent lighting tends to be too inefficient for spot lighting applications.

Given the widespread use of spot lighting and other types of lighting in general, vast energy savings for the benefit of both business and consumer users and the environment could be realized if the energy efficiency of lighting could be improved without compromising performance. Despite these potential energy savings and the growing environmental concerns that have existed for years in the world, however, there still exists a need for a sealed beam lamp having substantially improved energy efficiency. In particular, there exists a need for a highly-efficient, durable and relatively inexpensive spot light capable of providing aesthetically pleasing illumination with a uniform beam pattern to fit application and end-user expectations.

The advent of digital lighting technologies, i.e., illumination based on semiconductor light sources, such as light-emitting diodes (LEDs), offers a viable alternative to traditional fluorescent, HID, and incandescent lamps. Functional advantages and benefits of LEDs include high energy conversion and optical efficiency, robustness, lower operating costs, and many others. The LEDs' smaller size, long operating life, low energy consumption, and durability make them a great choice in a variety of lighting applications.

Accordingly, it would be desirable to provide an improved luminaire employing LED light sources, addressing the drawbacks of conventional technologies, while providing quality illumination. Besides the required high color rendering properties, quality-of-light considerations include several other observable and measurable criteria like useful and applicable spatial distribution of the illumination, and a white emission of desired color temperature with no "halos" or other texture and color artifacts. It is also desirable for this luminaire to retain commonly encountered form factors, so that existing hardware, sockets, and power connections could be employed, thereby further reducing costs and reducing waste associated with retooling, and facilitating adoption of the improved luminaire.

SUMMARY

The present invention relates generally to energy-efficient LED-based luminaires having standard form factors, so that they may be used with existing lighting hardware. More particularly, various embodiments of the present invention are directed to high-output lighting systems suitable for replacement of conventional lighting sources. Implementing various inventive concepts disclosed herein, these systems integrate efficient and compact power supply and control components for driving high-intensity LEDs together with thermal management and optical systems into a luminaire, providing for a form and function fit equivalent to common general-purpose incandescent, fluorescent and halogen luminaires. In some implementations, the present invention contemplates an integrated LED-based luminaire capable of producing beam spreads useful for spot lighting, such as a PAR38 spot light, employing LED-based light sources.

In sum, one aspect of the present invention is directed to an illumination apparatus, employing an LED-based light source, an optic coupled to the LED-based light source, a heat sink coupled to the LED-based light source, a base for mechanically and electrically engaging with a socket, and a housing made of an electrically non-conducting material and mechanically coupled to the base, wherein the LED-based light source, the optic, and the heat sink are disposed within the housing.

Another aspect of the present invention is directed to an illumination apparatus employing an LED-based light source comprising a first die and a second die coupled to a substrate. The first die is configured to produce a first spectrum of radiation and the second die configured to produce a second spectrum of radiation. The LED-based light source further employs a primary optic having first texturing on at least a portion thereof and, optionally, a secondary optic coupled to the LED-based light source and configured to collimate light produced by the LED-based light source, wherein the secondary optic has second texturing. In one exemplary implementation, the primary optic comprises a hemispherical lens raised a distance above the substrate.

Another aspect of the present invention is directed to a lighting apparatus configured in a Parabolic Aluminum Reflector (PAR) 38 form factor. The apparatus employs at least one first LED for generating first radiation having a first spectrum, and at least one second LED for generating second radiation having a second spectrum different from the first spectrum, wherein essentially white light generated by the apparatus includes a mixture of the first radiation and the second radiation. The apparatus further employs a switching power supply for providing power factor correction, an operating voltage for the at least one first LED and the at least one second LED, a first current for the at least one first LED, and a second current for the at least one second LED. The apparatus includes a base for mechanically and electrically engaging with a socket, and a housing made of an electrically non-conducting material, mechanically coupled to the base and configured in the PAR38 form factor, wherein the at least one first LED, the at least one second LED, and the switching power supply are disposed within the housing. The switching power supply is configured to control the first current and the second current such that the essentially white light generated by the apparatus has a color temperature in the range from approximately 2600K to 3000K, and an output of approximately 700 lumens at 10 Watts.

Another aspect of the present invention is directed to a lighting apparatus, employing at least one first LED for generating first radiation having a first spectrum, and at least one second LED for generating second radiation having a second spectrum different from the first spectrum. The at least one first LED and the at least one second LED are electrically connected in series between a first node and a second node. A series current flows between the first node and the second node when an operating voltage is applied across the first node and the second node. A switching power supply provides power factor correction and the operating voltage. The switching power supply controls at least one controllable current path connected in parallel with one of the at least one first LED and the at least one second LED so as to at least partially divert the series current around the one of the at least one first LED and the at least one second LED, such that a first current through the at least one first LED and a second current through the at least one second LED are different.

Another aspect of the present invention is directed to a method for controlling a color temperature of white light generated by an LED-based lighting apparatus during a thermal transient. The LED-based lighting apparatus includes at least one first LED for generating first radiation having a first spectrum and at least one second LED for generating second radiation having a second spectrum different from the first spectrum, wherein the white light results from a mixture of the first radiation and the second radiation. The at least one first LED and the at least one second LED are electrically connected in series between a first node and a second node, and a series current flows between the first node and the second node when an operating voltage is applied across the first node and the second node. The method includes generating a temperature signal representing a temperature proximate to the at least one first LED and the at least one second LED; and controlling, based on the temperature signal, at least one controllable current path connected in parallel with one of the at least one first LED and the at least one second LED so as to at least partially divert the series current around the one of the at least one first LED and the at least one second LED, such that a first current through the at least one first LED and a second current through the at least one second LED are different.

Another aspect of the present invention is directed to an apparatus for controlling a color temperature of white light generated by an LED-based light source during a thermal transient. The LED-based light source is mounted to a thermally conductive substrate, and the thermally conductive substrate has a recess formed therein proximate to the LED-based light source. The apparatus includes a printed circuit board having a tab for insertion into the recess formed in the thermally conductive substrate. The apparatus further includes a temperature sensor disposed on the tab of the printed circuit board, such that when the printed circuit board is inserted into the recess formed in the thermally conductive substrate, the temperature sensor is essentially embedded in the thermally conductive substrate proximate to the LED-based light source. The apparatus also includes a plurality of components disposed on the printed circuit board and constituting a switching power supply for providing power factor correction and an operating voltage for the LED-based light source, the switching power supply comprising at least one integrated circuit (IC) controller.

As used herein for purposes of the present disclosure, the term "LED" should be understood to include any electroluminescent diode or other type of carrier injection/junction-based system that is capable of generating radiation in response to an electric signal. Thus, the term LED includes, but is not limited to, various semiconductor-based structures that emit light in response to current, light emitting polymers, organic light emitting diodes (OLEDs), electroluminescent strips, and the like. In particular, the term LED refers to light emitting diodes of all types (including semiconductor and organic light emitting diodes) that may be configured to generate radiation in one or more of the infrared spectrum, ultraviolet spectrum, and various portions of the visible spectrum (generally including radiation wavelengths from approximately 400 nanometers to approximately 700 nanometers). Some examples of LEDs include, but are not limited to, various types of infrared LEDs, ultraviolet LEDs, red LEDs, blue LEDs, green LEDs, yellow LEDs, amber LEDs, orange LEDs, and white LEDs (discussed further below). It also should be appreciated that LEDs may be configured and/or controlled to generate radiation having various bandwidths (e.g., full widths at half maximum, or FWHM) for a given spectrum (e.g., narrow bandwidth, broad bandwidth), and a variety of dominant wavelengths within a given general color categorization.

The term "spectrum" should be understood to refer to any one or more frequencies (or wavelengths) of radiation produced by one or more light sources. Accordingly, the term "spectrum" refers to frequencies (or wavelengths) not only in the visible range, but also frequencies (or wavelengths) in the infrared, ultraviolet, and other areas of the overall electromagnetic spectrum. Also, a given spectrum may have a relatively narrow bandwidth (e.g., a FWHM having essentially few frequency or wavelength components) or a relatively wide bandwidth (several frequency or wavelength components having various relative strengths). It should also be appreciated that a given spectrum may be the result of a mixing of two or more other spectra (e.g., mixing radiation respectively emitted from multiple light sources). For purposes of this disclosure, the term "color" is used interchangeably with the term "spectrum." However, the term "color" generally is used to refer primarily to a property of radiation that is perceivable by an observer (although this usage is not intended to limit the scope of this term). Accordingly, the terms "different colors" implicitly refer to multiple spectra having different wavelength components and/or bandwidths. It also should be appreciated that the term "color" may be used in connection with both white and non-white light.

The term "color temperature" generally is used herein in connection with white light, although this usage is not intended to limit the scope of this term. Color temperature essentially refers to a particular color content or shade (e.g., reddish, bluish) of white light. The color temperature of a given radiation sample conventionally is characterized according to the temperature in degrees Kelvin (K) of a black body radiator that radiates essentially the same spectrum as the radiation sample in question. Black body radiator color temperatures generally fall within a range of from approximately 700 degrees K (typically considered the first visible to the human eye) to over 10,000 degrees K; white light generally is perceived at color temperatures above 1500-2000 degrees K.

Lower color temperatures generally indicate white light having a more significant red component or a "warmer feel," while higher color temperatures generally indicate white light having a more significant blue component or a "cooler feel." By way of example, fire has a color temperature of approximately 1,800 degrees K, a conventional incandescent bulb has a color temperature of approximately 2848 degrees K, early morning daylight has a color temperature of approximately 3,000 degrees K, and overcast midday skies have a color temperature of approximately 10,000 degrees K. A color image viewed under white light having a color temperature of approximately 3,000 degree K has a relatively reddish tone, whereas the same color image viewed under white light having a color temperature of approximately 10,000 degrees K has a relatively bluish tone.

The term "controller" is used herein generally to describe various apparatus relating to the operation of one or more light sources. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

In various implementations, a processor or controller may be associated with one or more storage media (generically referred to herein as "memory," e.g., volatile and non-volatile computer memory such as RAM, PROM, EPROM, and EEPROM, floppy disks, compact disks, optical disks, magnetic tape, etc.). In some implementations, the storage media may be encoded with one or more programs that, when executed on one or more processors and/or controllers, perform at least some of the functions discussed herein. Various storage media may be fixed within a processor or controller or may be transportable, such that the one or more programs stored thereon can be loaded into a processor or controller so as to implement various aspects of the present disclosure discussed herein. The terms "program" or "computer program" are used herein in a generic sense to refer to any type of computer code (e.g., software or microcode) that can be employed to program one or more processors or controllers.

It should be appreciated that all combinations of the foregoing concepts and additional concepts discussed in greater detail below (provided such concepts are not mutually exclusive) are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating principles.

FIGS. 10A and 10C illustrate an exploded view and an assembled cross-sectional view, respectively, of an LED-based luminaire according to another implementation of the present invention;

FIG. 10B illustrates a top-down view of the cover lens of the LED-based luminaire of FIG. 10A;

FIG. 16-I and FIG. 16-II are portions of FIG. 16 which is a circuit diagram illustrating a power factor correction stage of the power supply shown in FIG. 15, according to one implementation of the present invention;

FIG. 17-I to FIG. 17-V are portions of FIG. 17 which is a circuit diagram illustrating the power factor correction stage of the power supply shown in FIG. 15, together with an associated controller, according to one implementation of the present invention;

FIG. 18-I and FIG. 18-II are portions of FIG. 18 which is a circuit diagram illustrating a load control stage of the power supply shown in FIG. 15, according to one implementation of the present invention;

FIG. 19-I to FIG. 19-III are portions of FIG. 19 which is a circuit diagram illustrating the load control stage of the power supply shown in FIG. 15, together with an associated controller, according to one implementation of the present invention;

DETAILED DESCRIPTION

Various implementations of the present invention and related inventive concepts are described below, include certain implementations relating to PAR38 luminaires. It should be appreciated, however, that the present invention is not limited to any particular manner of implementation, and that the various embodiments discussed explicitly herein are primarily for purposes of illustration. For example, the various concepts discussed herein may be suitably implemented in a variety of luminaires having different form factors and light output.

As mentioned above, some aspects of the invention disclosed herein relate to high-output lighting systems suitable for replacement of conventional light sources. These systems integrate efficient and compact power supply and control components for driving high-intensity LEDs together with thermal management and optical systems into a luminaire, providing for a form and function fit equivalent to common general-purpose incandescent, fluorescent and halogen luminaires. Applicants have recognized and appreciated that no component or subsystem of a high-performance LED-based luminaire can be designed in isolation and that system performance is a result of interrelated technical issues. Thus, impact of design choices in one area of the system may have undesirable consequences in other areas. For example, attempting to generate more output from a LED source may come at the cost of greater power density, exacerbating thermal loading and, in turn, overall system efficiency. Manipulating die and package constraints may have downstream effects that need to be addressed through careful consideration of optics. Accordingly, the approach disclosed in detail below seeks to optimize LED source efficiency and geometry with a variety of system design concerns, including efficient thermal management and power management.

Figure 1A:
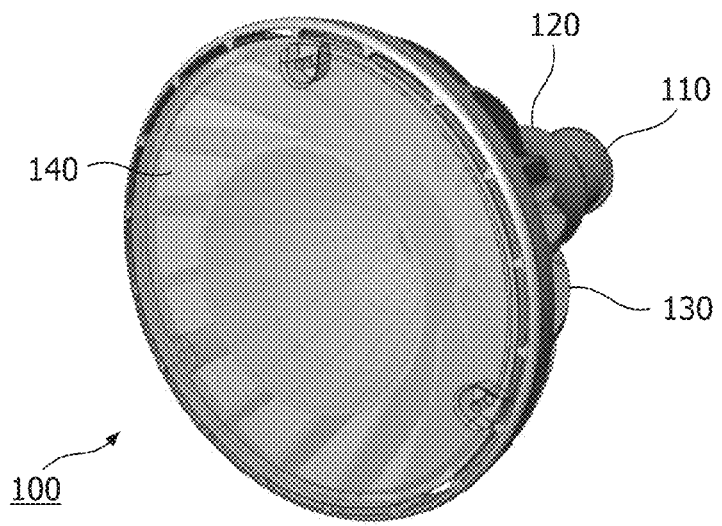
FIGS. 1A and 1B illustrate frontal and rear perspective views, respectively, of an LED-based luminaire according to one implementation of the present invention.
Figure 1B:
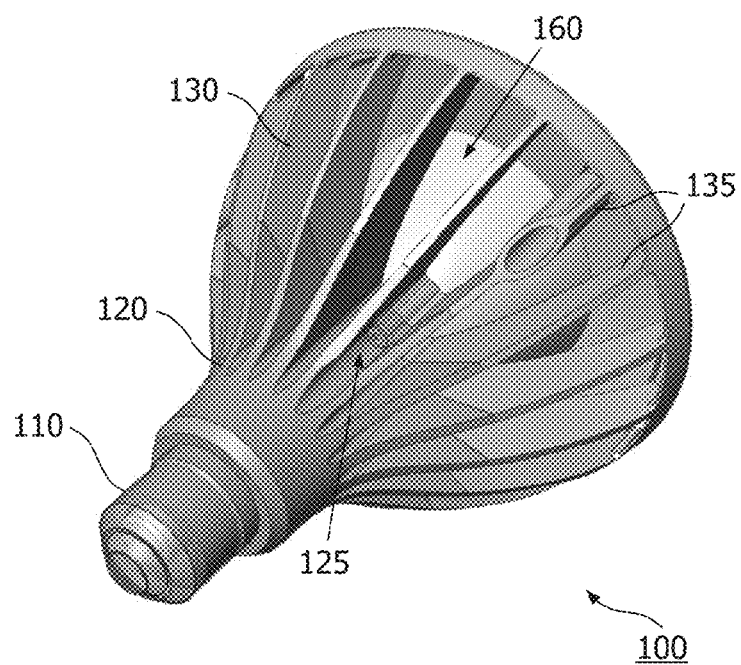

FIGS. 1A and 1B illustrate one non-limiting example of an LED-based luminaire 100 according to one implementation of the present invention. The luminaire 100 includes a screw base 110, a base enclosure 120, a heat sink 130, a cover lens 140, and a reflector optic 160, described in further detail below. Screw base 110 is configured to screw into standard lighting sockets for supplying AC power to luminaire 100, and therefore may be an Edison style screw base or any other suitable screw base. Base enclosure 120 can be made from metal or impact-resistant plastic material, such as, for example, acrylonitrile butadiene styrene (ABS) by any conventional process such as injection molding. In various implementations of the current invention, base enclosure 120 has heat dissipating features, such as fins 121 (shown in FIG. 2, described below), which are useful for conducting heat and/or for facilitating cooling air flow across the luminaire. The base enclosure is connected to the heat sink 130 by any conventional fastening means, for example, screws 125.

The heat sink 130 is formed from a heat-conducting material, for example aluminum, and is configured to facilitate heat dissipation while remaining relatively lightweight. For example, in one implementation, the heat sink 130 has a cage-like design and includes a plurality of heat-dissipating fins 135 spread apart, providing substantial surface area for heat dissipation. The heat sink 130 may be treated to facilitate heat dissipation, for example by sand-blasting.

Cover lens 140 can be made from any known transparent materials, such as glass, acrylic, or polycarbonate. Cover lens 140 is seated on landings of heat sink 130 and then affixed with any convenient fasteners or connector(s), such as screws. In one implementation, as illustrated in FIGS. 1A-1B, LED-based luminaire 100 has a form factor of a PAR38 lamp, so that its widest diameter measures 4.75 inches. Other form factors are also possible.

Figure 2:
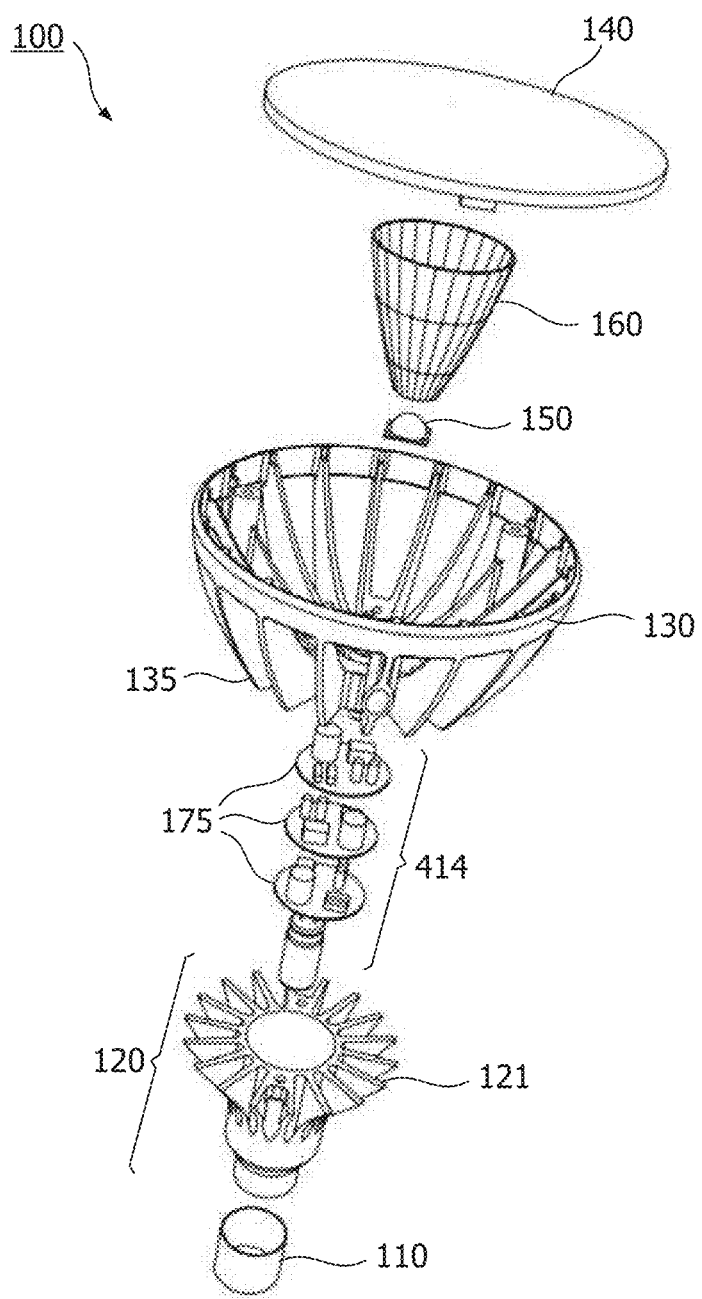
FIG. 2 illustrates an exploded view of the LED-based luminaire of FIGS. 1A-1B.
Figure 3:
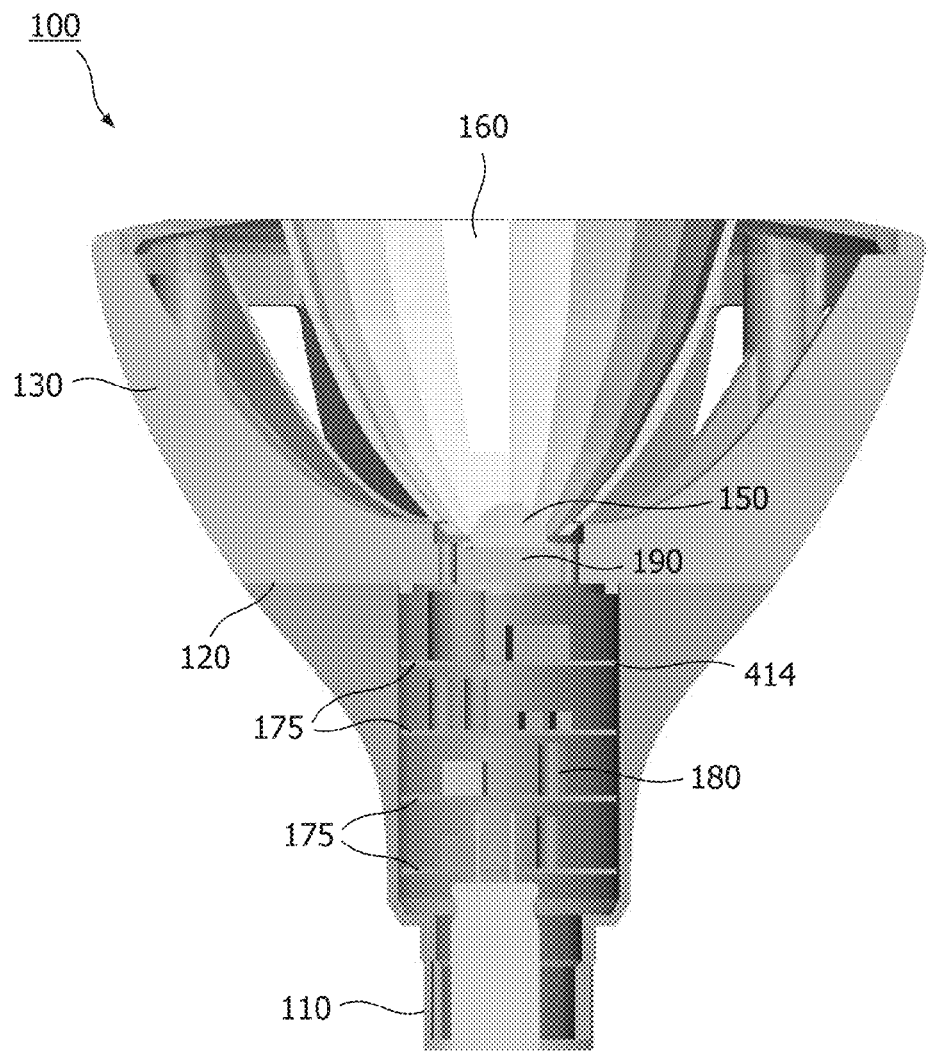
FIG. 3 illustrates a cross-sectional view of the LED-based luminaire of FIGS. 1A-1B, schematically illustrating the stacked power supply according to one implementation of the present invention.

Referring now to FIGS. 2 and 3, an exploded view and cross-sectional view, respectively, of luminaire 100 reveal the features housed within base enclosure 120 and heat sink 130. In various implementations of the present invention, base enclosure 120 houses a power supply and electronics control module 414 (also referred to herein simply as "power supply"), including one or more printed circuit boards 175 having power management and driver circuitry components 180 disposed thereon (e.g., power supply, controller/processor, and/or memory components, etc.) for driving and controlling the light-emitting diodes (LEDs) provided in an LED module 150, described in greater detail below.

Power supply 414 may have various configurations in order to optimize its performance while taking into account space limitations of the base enclosure. For example, in one implementation like that shown in FIGS. 2 and 3, the power supply includes multiple printed circuit boards stacked one on top of the other and secured with the base enclosure at desired intervals. The circuit boards are electrically connected by wires running between them. In other implementations of the present invention, a continuous (e.g., flexible) circuit board is fitted into the space provided within the base enclosure, for example, by rolling or winding. In still another implementation, a single circuit board is affixed perpendicularly to the heat, as described with respect to FIGS. 10A and 10C, below. Other configurations are also possible.

Some general examples of LED-based lighting units and methods for their control, suitable for use in conjunction with luminaires according to the present disclosure, can be found, for example, in U.S. Pat. Nos. 6,016,038, and 6,211, 626. Also, some general examples of digital power processing and integrating power and data management within an LED fixture, suitable for use in conjunction with luminaires according to the present disclosure, can be found, for example, in U.S. Pat. No. 7,233,115, U.S. Pat. No. 7,256, 554, and U.S. patent application Ser. No. 12/113,320, each of which is incorporated herein by reference. Some specific examples of power supplies and control electronics according to embodiments of the present invention are discussed in detail below in connection with FIGS. 15-22.

The electrical connections between power supply 414 and LED module 150 may be provided in any suitable manner, such as via holes in the base of heat sink 130. Other forms of interconnection are also possible.

In various implementations of the present invention, and as illustrated in FIG. 3, a thermal connector 190 is disposed between LED module 150 and heat sink 130, to provide thermal conductivity therebetween to facilitate heat dissipation. The thermal connector 190 is made from a thermally conductive material, such as copper, and is attached to the back of the LED module by inductive soldering or any other suitable method. This configuration minimizes the number of thermal interfaces between the LED module 150 and the heat sink 130 and, in turn, reduces the thermal resistance seen by the LED module. The thermal connector 190 may take the form of a plug, or slug, as shown in FIG. 3, that is inserted into a cavity, or recess, in the heat sink, or may take any other suitable form. For example, according to one embodiment, the thermal connector 190 may be formed as a thin layer on the heat sink, or as one or more metallic traces, such as copper, formed on a portion of a surface of the heat sink 130. The LED module may then be soldered to the metallic trace(s), for example using inductive soldering.

Figure 4:
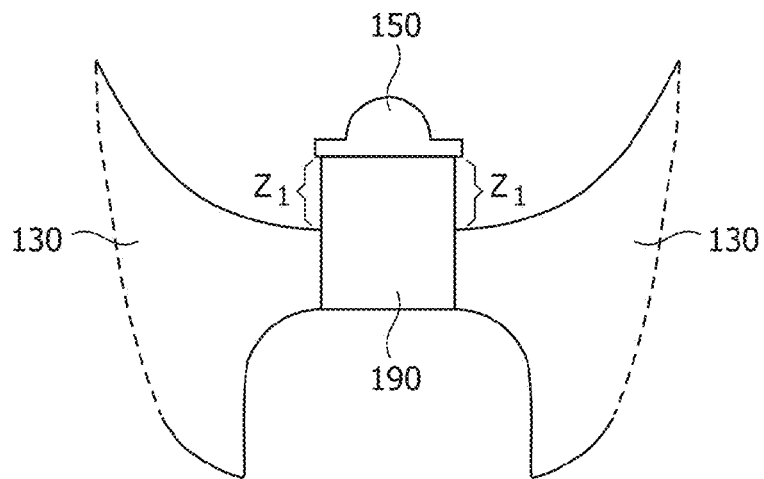
FIG. 4 is a close-up view illustrating the relative positioning of the LED module and thermal connector shown in FIG. 3.

FIG. 4 is a close-up view of the thermal connector 190, LED module 150, and a portion of the heat sink 130, the outer edges of which are shown by dashed lines to indicate that only a portion of the heat sink is shown. As illustrated, in one non-limiting embodiment the thermal connector 190 is not flush with the heat sink 130, but rather extends above a surface of the heat sink 130 by an amount $Z_1$. Thus, the LED module 150 is positioned above the heat sink by the distance $Z_1$. By so positioning the LED module 150 above the heat sink surface, the position of the LED module 150 relative to the reflector optic 160 (shown in FIG. 3) may be optimized. Thus, the distance $Z_1$ may take any suitable value, for example being 0.5 mm, 1 mm, or any other suitable value.

The LED module 150 may take any suitable form, as the various aspects of the invention are not limited to use with any particular type of LED light source. FIGS. 5 and 6A-6C illustrate examples of features which the LED module 150 may include. However, it should be appreciated that these features are only optional, and that other forms of the LED module 150 are possible.

Figure 5:
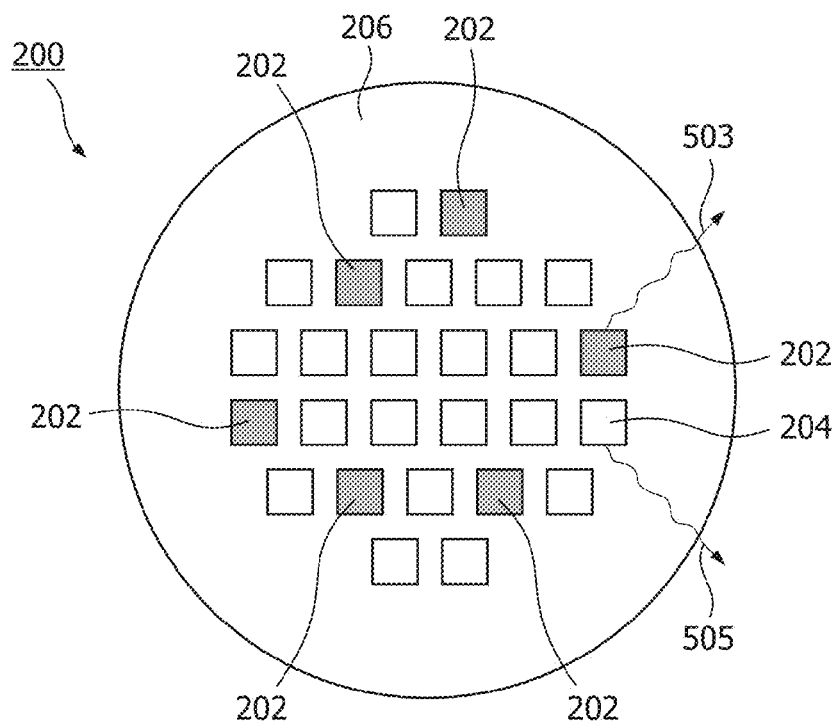
FIG. 5 is a top plan view schematically illustrating an LED die layout of an LED module according to one implementation of the present invention.

As shown in FIG. 5, according to one embodiment, LED module 150 includes a substrate 206 (e.g., a printed circuit board) upon which are disposed multiple LED die 202 and 204. The properties of the individual LED die are selected to provide the particular type of light output desired for LED-based luminaire 100. For example, in various embodiments, a first type of LED die 202 may include one or more LED junctions for generating first radiation having a first spectrum, and a second type of LED die 204 may include one or more LED junctions for generating second radiation having a second spectrum different from the first spectrum. While a general example of two different types of LEDs is given for the luminaire, it should be appreciated that a variety of different types of LEDs may be employed together in various numbers/combinations to provide resulting light based on a mixture of respective different source spectrums.

In one exemplary implementation of the present invention, the light-emitting properties of the LED die are respectively selected to provide white light of a desired color temperature. For example, one implementation of an LED module configured to generate essentially white light may include a number of dies which respectively emit different spectra of electroluminescence that, in combination, mix to form essentially white light. In another implementation, a white light LED may be associated with a phosphor material that converts electroluminescence having a first spectrum to a different second spectrum. In one example of this implementation, electroluminescence having a relatively short wavelength and narrow bandwidth spectrum "pumps" the phosphor material, which in turn radiates longer wavelength radiation having a somewhat broader spectrum.

Referring to FIG. 5, the layout of the LED die (or package) in LED module 150 is selected to provide the type of combined light desired for LED-based luminaire 100. In certain implementations, LED-based luminaire 100 emits a white light of a predetermined color temperature or range of color temperatures. In various implementations, the layout includes a combination of direct emission LEDs (e.g., essentially monochromatic or narrow bandwidth radiation) and phosphor-conversion LEDs (e.g., relatively broader band radiation). For example, in one implementation, a plurality of first LEDs 202 emitting first radiation 503 is combined with a plurality of second LEDs 204 emitting second radiation 505. The first LEDs 202 may be direct emission LED die, while the second LEDs 204 may be phosphor-conversion LED die.

In one implementation, the layout shown in FIG. 5 is used to produce white light. The first LEDs 202 are direct emission LED die, and the second LEDs 204 are phosphor conversion LED die. The resulting correlated color temperature (CCT) of white light depends on the amount of phosphor material that is applied to the blue emission LEDs (i.e., second LEDs 204 in this non-limiting example), as well as the amount of light coming from the red direct emission LEDs (i.e., first LEDs 202 in this non-limiting example). To achieve the desired color point, both parameters are controlled together, for example, by varying the amount of red emission from the source module by biasing the phosphor conversion and direct conversion LEDs independently.

In one implementation for providing white light having a correlated color temperature (CCT) of about 2800 Kelvin, a mixture of twenty second LEDs 204, each of which is a phosphor-conversion LED die in this example, and six first LEDs 202, each of which is a direct emission LED die in this example, are provided, however, other numbers and combinations of die are possible. The second LEDs 204 include blue LEDs coupled with a suitable phosphor material for generating white light, available from Cree, Inc. of Durham, N.C. The first LEDs 202 include red LEDs, also available from Cree, Inc. of Durham, N.C. In certain implementations of the current invention, the ratio of direct-emission LED die (e.g., first LEDs 202) to phosphor-conversion LED die (e.g. second LEDs 204) is selected to provide a high color rendering index (CRI), within a range of about 85-90, or higher, and a CCT of about 2800 Kelvin. In the implementation of FIG. 5, this ratio is 3/10 with 6 direct-emission LEDs and 20 phosphor-conversion LEDs.

In general, the number of LEDs in the LED module is selected to provide favorable driver efficiencies and luminous efficacy. In various implementations, a larger number of smaller LED chips are used. The size of the LED chips is optimized within the form factor constraints of the luminaire (particularly in view of the diameter of the rear opening of the reflector 160), to provide favorable light output, thermal properties, and current density, balanced against packaging costs, substrate and optics costs, die bonding costs, yield losses, etc. In some implementations, standard commercially-available LED chips having a diameter of 700 micron are used. In other implementations, this invention contemplates using customized LED chips to further lower costs of the LED module while maintaining desired levels of overall performance. In particular, multiple benefits are achieved by increasing the number or density of LEDs, such as optical, electrical, thermal, packaging, cost, and energy efficiency benefits. First, a denser constellation of die produces a more uniform light output, thereby improving color mixing, glare issues, and luminance. Second, a larger number of LEDs, when connected in series, permits the use of lower electrical currents, which can be provided by lower cost drivers. Third, the power density of a larger number of smaller chips is lower and overall thermal qualities improve. As the power requirement is reduced by using smaller die/package, the packaging costs also drop. Finally, the combined electrical, thermal, and optical benefits yield greater efficiencies of the overall, integrated system.

In general, the layout of the various die types is selected to provide good color mixing and improved uniformity of the color and/or color temperature, so as to achieve a uniform visual appearance of the light output of luminaire 100. In the implementation of FIG. 5, the first LEDs 202 (e.g., direct emission LED die) are disposed somewhat toward the edges of LED module 150, but in a randomly distributed fashion. This configuration provides a very uniform color distribution at locations both near and far from luminaire 100.

In various implementations, the electrical currents through the individually controlled die types are selected to, in part, achieve the desired luminous flux and efficacy of LED-based luminaire 100. For example, in order to achieve a white light output from luminaire 100 having a CCT of about 2800 Kelvin and a luminous flux of about 600 lumens, the current through second LEDs 204, which are connected in series, is about 0.142 amps, and the current through first LEDs 202, also connected in series, is about 0.125 amps. The output and efficiency of this PAR38 implementation is about triple the output and twice the efficiency of some existing PAR38 lamps, representing a significant improvement over conventional approaches.

Figure 6A:
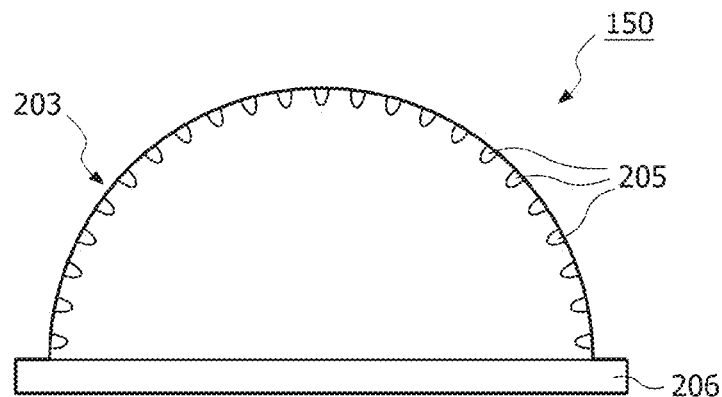
FIGS. 6A and 6B are side views illustrating LED modules including texturing, according to various implementations of the present invention.
Figure 6B:
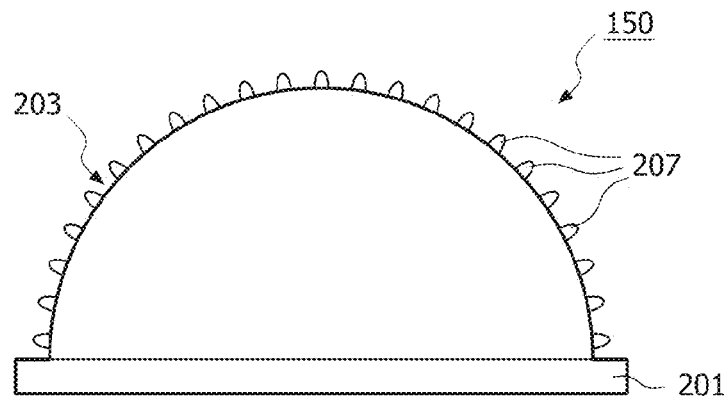

As shown in FIGS. 6A and 6B, in various implementations LED module 150 further includes a primary optic. The primary optic in FIGS. 6A and 6B is a lens 203 mounted on the substrate 206 which may support one or more LED die. The lens 203 may be a silicone lens that covers the LED die. According to some embodiments, the primary optic of an LED module 150 may include texturing to facilitate mixing of light produced by the LED module 150.

For example, referring to FIG. 6A, the lens 203 may include texturing on an inner surface in the form of bumps 205. There may be any suitable number of bumps 205, and the bumps may have any suitable shape and size. In addition, the bumps 205 may take any suitable spacing relative to each other, and may be formed over substantially the entire inner surface of lens 203, or over only a portion of the inner surface of lens 203.

Alternatively, as shown in FIG. 6B, an LED module 150 may include a lens 203 having texturing on an outer surface, as shown by the bumps 207. Similar to the bumps 205 described in connection with FIG. 6A, the bumps 207 may take any suitable shape, size, and spacing, and any number of bumps 207 may be included. In addition, it should be appreciated that the bumps 205 shown in FIG. 6A, and the bumps 207 shown in FIG. 6B, may only cover a portion of the lens 203, and not necessarily the entire lens 203. Furthermore, it should be appreciated that the bumps 205 and 207 may be used in combination, such that the lens 203 may include texturing on both an inner and outer surface. Moreover, it should be appreciated that bumps 205 and 207 are one non-limiting example of texturing of a primary optic, and that other forms of texturing, such as indentations, ridges, channels, gratings, or any other suitable type of texturing may be employed. Furthermore, it should be appreciated that lens 203 may not include any texturing at all in some embodiments.

Figure 6C:
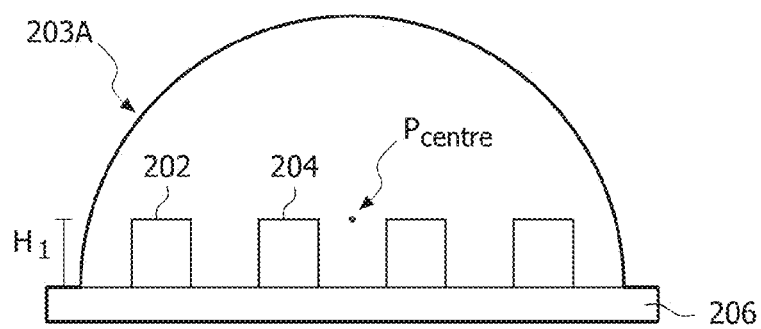
FIG. 6C is a side view illustrating one embodiment of the lens 203 of FIGS. 6A-6B, in which the lens has a raised hemispherical shape.

Furthermore, the lens 203 may take different shapes. For example, according to one embodiment, the lens 203 is substantially hemispherical. However, in various implementations, the lens 203 is molded to have a shape that is not perfectly hemispherical. Rather, the center of the hemisphere is raised by some distance. FIG. 6C illustrates an example. As shown, the lens 203A is not perfectly hemispherical, but rather includes a hemispherical portion raised an amount $H_1$ above the substrate 206. Thus, the center of the hemisphere, shown as $P_{center}$, is raised above the substrate 206 by the amount $H_1$, and may be substantially co-planar with an upper surface of the first LEDs 202 and/or the second LEDs 204. Thus, the profile of the dome inhibits light from being redirected toward the die and lost, and permits the secondary optics, such as the cover lens 140, to capture more of the light emitted from the primary optic. In various implementations, the area covered by the primary optic extends beyond the area of the LED die to an extent that reduces or eliminates light losses due to high angles associated with the walls of the primary optic. In one implementation, the diameter of the array of LED die of LED module 150 is about 7 mm, and the diameter of the primary optic (e.g., lens 203) is about 11 mm.

As illustrated in FIGS. 1B, 2, and 3, LED-based luminaire 100 also includes a reflector optic 160, which is housed within heat sink 130 for shaping the beam of light emitted by LED module 150. In various implementations, reflector optic 160 is made from a plastic material that is coated with a reflective material, such as aluminum. LED module 150 is positioned so that light emitted by the primary optic (e.g., lens 203) transmits through a rear opening (i.e., an exit aperture) of the reflector optic 160. Cover lens 140 is positioned above reflector optic 160 for providing a beam of uniform light. In various implementations, an additional holographic diffuser (not shown)—for example, a 5° diffuser—can be added to the secondary optic to further homogenize the light output. However, it should be appreciated that in some implementations no diffuser may be included over the exit aperture formed by the reflector optic. Preferably, the angular distribution of the lighting output of the respective different spectrum LED sources (e.g., the blue and red LED "channels" in one exemplary implementation) is close to identical. In one implementation, using a 90% reflective surface of reflector optic 160, the optical system efficiency is about 83% with the beam angle of about 25 degrees FWHM.

Figure 7A:
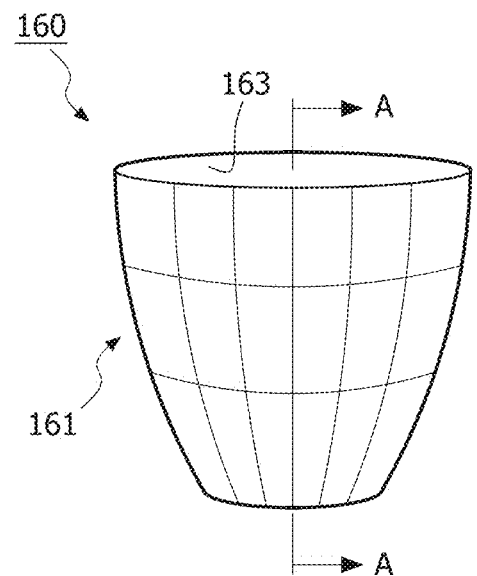
FIGS. 7A-7B illustrate a perspective view and a cross-sectional view, respectively, of the reflector optic shown in FIGS. 2-3.

The reflector optic 160 may take any suitable shape. As shown in FIG. 7A the reflector optic 160 may include an outer surface 161 which is a faceted surface. However, it should be appreciated that the outer surface 161 may be continuous in some embodiments, as the various aspects of the invention are not limited in this respect. Because the LED module is disposed inside the reflector optic 160, the shape of the outer surface 161 may not impact the functionality of the reflector optic.

Figure 7B:
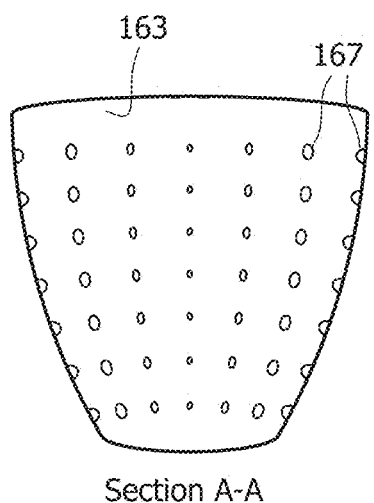

The reflector optic 160 also includes an inner surface 163, which is shown in further detail in FIG. 7B, which illustrates the reflector optic 160 along the line A-A in FIG. 7A. As shown in FIG. 7B, the inner surface 163 of the reflector optic 160 may include texturing. For example, the inner surface 163 may include one or more bumps 167, which may take any suitable size and shape. Such texturing may facilitate mixing of light produced by an LED light source, such as LED module 150. Thus, it should be appreciated that the texturing illustrated in FIG. 7B is optional, and that in those situations in which texturing is included on the inner surface 163 of reflector optic 160, the texturing may take any suitable form and patterning. For example, the inner surface 163 of reflector optic 160 may include texturing in the form of divots, ridges, facets, gratings, raised surfaces in geometric patterns, or any other suitable type of texturing.

It should be appreciated that the features illustrated in FIGS. 6A-6C, 7A, and 7B may be used alone or in combination. For example, according to some embodiments, a luminaire may include an LED module with texturing and a reflector optic with texturing. According to other embodiments, only one or the other may be textured. According to some embodiments, neither the LED module nor the reflector optic is textured.

Figure 8:
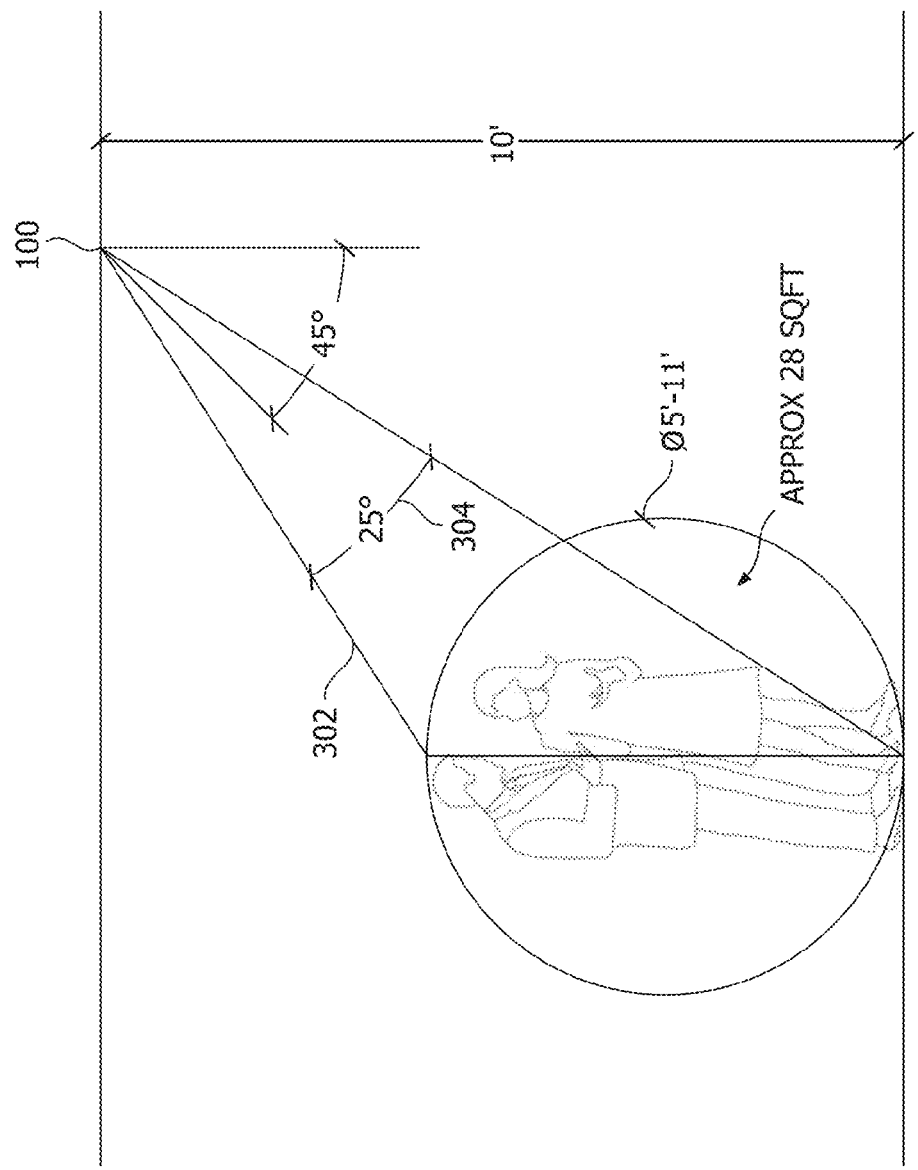
FIG. 8 illustrates a spot-lighting application for an LED-based luminaire according to one implementation of the present invention.

Various operating characteristics of the luminaire 100 are now described. For example, according to one aspect, a luminaire implementing one or more aspects described herein may operate at a color temperature of approximately 2700-2800 K. The lighting system may further demonstrate a CRI greater than or equal to 90, or in some embodiments within the range from 85 to 90. Moreover, the lighting system may output 70 lumens per watt, and provide 700 lumens at 10 watts. Furthermore, the beam angle provided by luminaire 100, or other lighting systems as described herein, may be sufficient to provide effective indoor or outdoor illumination. FIG. 8 illustrates an example.

Referring to FIG. 8, as described above, spot lighting is one particularly useful application for the LED-based luminaire 100 having the PAR38 form factor. As shown in FIG. 8, the spatial distribution of a light beam 302 is such that a beam angle 304 of about 25 degrees is achieved. Furthermore, in this particular implementation, the light output of luminaire 100 is uniform enough and, for a given ceiling height and lighting angle, the spot size is appropriately dimensioned to provide excellent lighting of merchandise and other commonly displayed items.

In summary, luminaire 100 is a highly-efficient, durable, environmentally friendly LED-based lamp, which is compatible with standard lighting hardware, provides uniform light distribution and has excellent heat dissipation and color rendering properties. For example, an output of about 600 lumens at about 55 lumens per watt at steady state has been achieved with one implementation of the current invention, and an output of 700 lumens at about 70 lumens per watt has been achieved in another implementation, thereby providing substantial improvements over conventional sources.

While FIGS. 1A-7B have illustrated non-limiting examples of one or more features of one exemplary luminaire, it should be appreciated that other configurations and form factors are possible. For example, according to one aspect, a luminaire may include a shroud, or housing, within which one or more components of the luminaire may be disposed. The shroud may be formed of plastic, or any other suitable electrically non-conducting material, such as polycarbonate or ABS. According to some embodiments, the shroud may be formed of glass, which may provide heat dissipation. The shroud may inhibit external access to electrically active components of the luminaire, therefore reducing the risk of shock or fire. According to some aspects, the shroud encompasses substantially all the components of the luminaire, and may include one or more holes to facilitate heat dissipation.

Figure 9A:
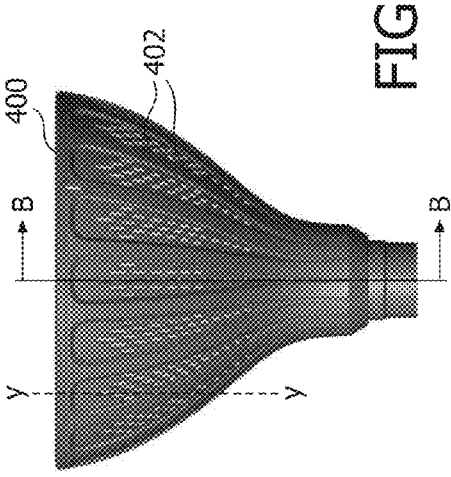
FIGS. 9A-9C illustrate a top-down view, a side view, and a cross-sectional view, respectively, of a housing in which various components of an LED-based luminaire may be disposed according to one implementation of the present invention.
Figure 9B:
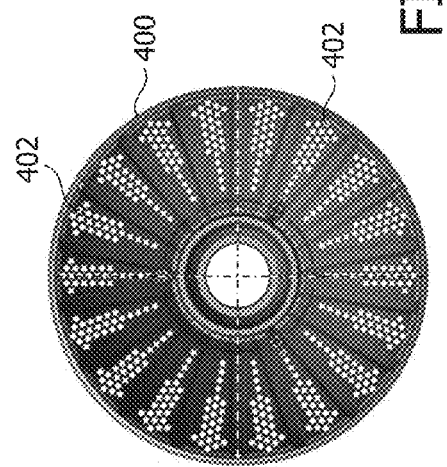
Figure 9C:
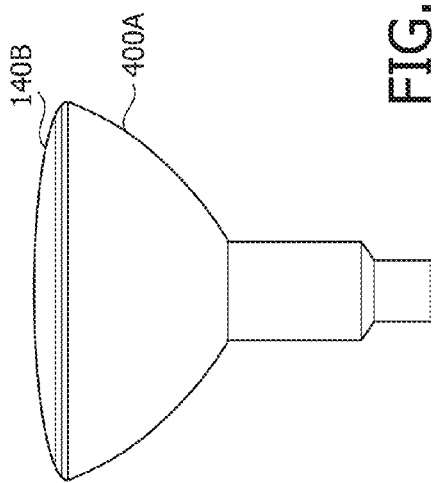

FIGS. 9A-9C illustrate one non-limiting example of a non-conducting shroud according to one embodiment. FIG. 9A illustrates a top-down view of a shroud 400 which includes a plurality of holes 402. In the non-limiting example of FIG. 9A, each of the plurality of holes 402 is less than or equal to 2 mm in diameter. It should be appreciated that other sizes are also possible. Furthermore, the pattern of holes 402 illustrated in FIG. 9A is merely an example, as any number and arrangement of holes 402 may be included. The number and arrangement of holes 402 may be selected to optimize thermal dissipation from the inside of the shroud to the outside, thereby preventing the luminaire from overheating.

FIG. 9B illustrates a side view of the shroud 400 of FIG. 9A. From this view, it should be appreciated that each of the holes 402 is oriented along the direction of the line Y-Y, in other words along the length of the shroud 400. Thus, the axis of symmetry of a hole (e.g., the line Y-Y may be the axis of symmetry of one hole) may be positioned to not intersect live electrical components of the luminaire. Orienting the holes 402 in this direction may inhibit access to active electronic components, thus reducing the risk of shock or fire. However, other orientations for the holes 402 are possible.

FIG. 9C illustrates a cross section of the shroud 400 taken along the section B-B as shown in FIG. 9B. From this view, it can be appreciated that the shroud 400 may be formed to include a cavity 404, which may be suitable for holding a power supply, control circuit, or other elements of a luminaire, as described in greater detail below.

Figure 9D:
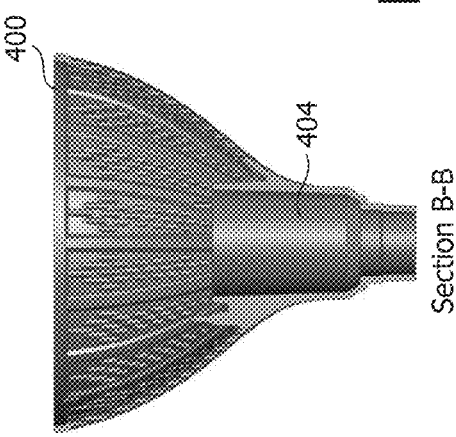
FIG. 9D illustrates an alternative housing to that shown in FIGS. 9A-9C.

FIG. 9D illustrates an alternative shroud 400A to that shown in FIGS. 9A-9C. The shroud 400A is made of glass, and does not have the holes 402. Rather, the glass itself may provide sufficient heat dissipation. However, the shaping of the shroud 400A may be similar to, or substantially the same as, the shaping of shroud 400. In addition, according to some embodiments, the shroud 400A may be connected to a glass cover lens 140B by any suitable method. Also, in one embodiment, the glass shroud 400A may be formed with fins to increase the surface area of the shroud, and thus facilitate thermal dissipation.

FIG. 10A illustrates an exploded view of a luminaire 100A according to another embodiment. The luminaire 100A includes the shroud 400 discussed above in connection with FIGS. 9A, 9B, and 9C, which in this non-limiting example is made of polycarbonate or ABS. A screw base 110, which may be an Edison style screw base, may be connected to the shroud 400 to enable the luminaire 100A to be screwed into a conventional lighting socket. The luminaire 100A further includes power supply and control electronics 414 disposed within the cavity 404 of the shroud 400 when the luminaire 100A is assembled. As will be described in further detail below, a temperature sensor 416, such as a thermister, may also be included to monitor a temperature of the luminaire 100A. As with luminaire 100, the luminaire 100A further includes the LED module 150, which may be mounted to heat sink 130 by inductively soldering the LED module 150 to thermal connector 190 which is implanted within, or otherwise connected to the heat sink 130.

Electrical connection between the power supply and control electronics 414 and the LED module 150 may be provided in any suitable manner. According to the non-limiting implementation of FIG. 10A, a ring-shaped circuit board 424 is provided, which is disposed around the LED module 150 and electrically connected to the power supply 414 by one or more wires, or metal traces, as shown in greater detail in FIGS. 12A and 12B. Other manners of providing electrical connection to the LED module 150 are also possible.

The luminaire 100A also includes reflector optic 160. The reflector optic 160 may be mounted to the heat sink 130, such that the LED module 150 is disposed within the reflector optic 160, so that light emitted from the LED module 150 is reflected, collimated, and/or focused by the reflector optic 160. Finally, a cover lens 140A may be included, and may be secured to the shroud 400 by any suitable manner, such as for example, clipping into the shroud 400, being fastened by screws, being secured by glue, or being fastened in any other suitable manner.

As shown in FIG. 10B, which is a top-down view of the cover lens 140A, the cover lens may have a central portion 430 which may be substantially transparent to light emitted by the LED module 150, or which may be a diffuser in some embodiments. The central portion 430 may substantially correspond in size to the reflector optic 160. In addition, the cover lens 140A may include an outer portion 432. The reflector optic 160 may confine light exiting the LED module 150 to exiting through the central portion 430 of the cover lens 140A. Therefore, light from the LED module 150 does not pass through the outer portion 432 of the cover lens 140A. However, the outer portion 432 of the cover lens 140A may include one or more holes 434 to facilitate dissipation of heat from the luminaire. The holes 434 may take any suitable number, shape, and patterning. For example, according to some embodiments, each of the holes 434 is equal to or less than approximately 2 mm in diameter.

Figure 10C:
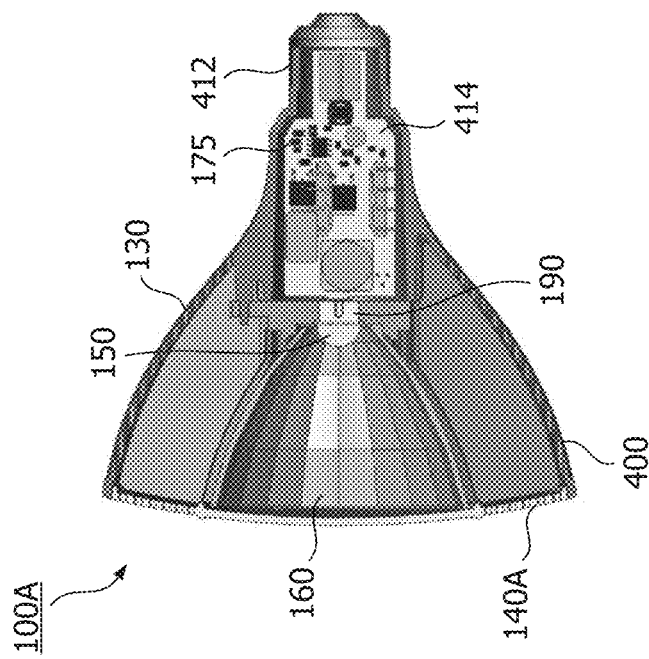

FIG. 10C illustrates a cross section of the luminaire 100A when assembled. For simplicity, not all components of the luminaire 100A are numbered in FIG. 10C. However, it can be seen that the shroud 400 is fastened to the cover lens 140A and the screw base 110 such that the remaining components of the luminaire are contained therein. Also, it should be appreciated that the power and control electronics 414 are mounted on a circuit board which is oriented perpendicularly to a base portion of the heat sink 130.

Figure 11:
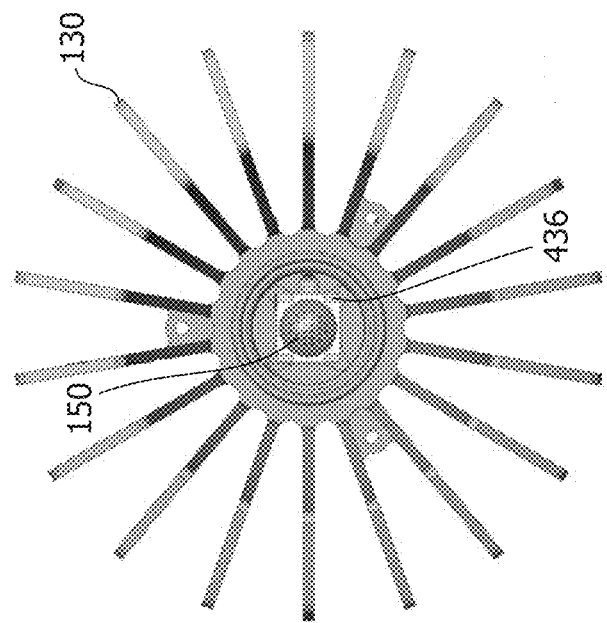
FIG. 11 is a top-down view illustrating the relative positioning of the LED module and heat sink of FIG. 10A.

Various features of the luminaire 100A are now illustrated and described in greater detail. For example, FIG. 11 illustrates the relative positioning of the LED module 150 and the heat sink 130. As shown in this top-down view, the heat sink 130 includes a plurality of fins which facilitate heat dissipation. The LED module 150 is disposed in the center of the heat sink 130, and may be mounted on the thermal connector 190, which is not visible in FIG. 11. Solder pads 436 may be included to facilitate soldering of the LED module 150 to the ring-shaped circuit board 424 and/or to the thermal connector 190.

Figure 12A:
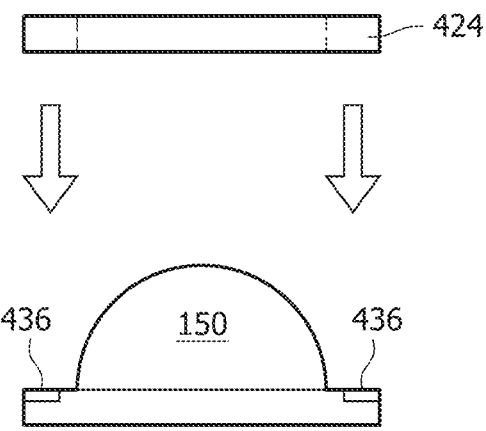
FIGS. 12A-12B illustrate a side view and a top-down view, respectively, of the LED module and ring-shaped circuit board of FIG. 10A.
Figure 12B:
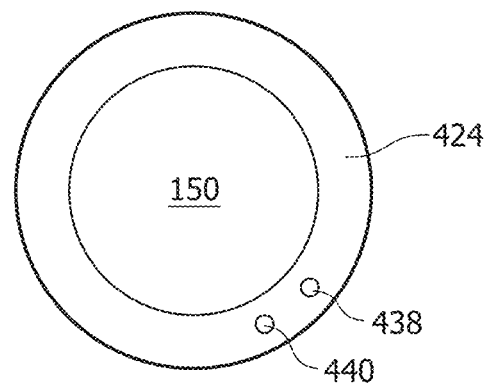

FIGS. 12A and 12B illustrate the relative positioning of the ring-shaped circuit board 424 and the LED module 150. As shown in FIG. 12A, which is a side view of the two illustrated components, the ring-shaped circuit board 424 may be brought into contact with the LED module 150 by moving it in the direction of the arrows in the figure. As mentioned with respect to FIG. 11, the LED module 150 may include one or more solder pads 436 which may facilitate bonding of the ring-shaped circuit board 424 to the LED module 150.

As shown in FIG. 12B, which is a top-down view of FIG. 12A, the ring-shaped circuit board 424 may be positioned around the LED module 150. The ring-shaped circuit board may include holes 438 and 440 which may accommodate electrical wires from the power supply and control electronics 414, shown in FIG. 10A, providing electrical interconnection between the LED module 150 and the power supply and control electronics 414. It should be appreciated that any number of holes and relative positioning of holes may be used, and that the ring-shaped circuit board 424 may include one or more metal traces as appropriate for providing proper electrical functionality.

Figure 13A:
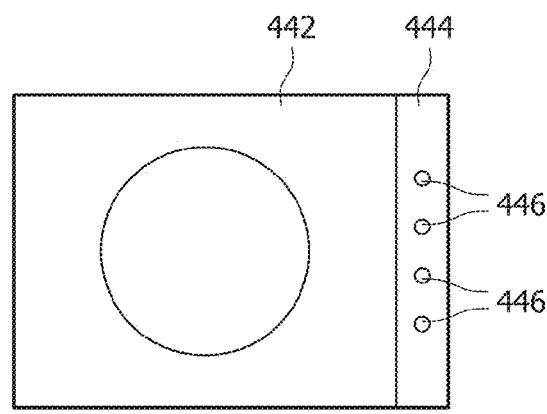
FIGS. 13A and 13B illustrate alternative configurations of an LED module and a flexible circuit board, according to various implementations of the present invention.

It should be appreciated that the configuration illustrated in FIGS. 12A and 12B is one non-limiting example. Thus, other forms of circuits and LED modules may be used. For example, as shown in FIG. 13A, an alternative implementation to using a ring-shaped circuit board may involve positioning a circuit and electrical connections on one side of the LED module. As shown, an LED module 442 may be connected to a flexible circuit 444, having one or more electrical contact points 446. The electrical contact points 446 are arranged on a single side of the LED module 442, which may simplify formation of electrical interconnections between the LED module 442 and a power supply. The LED module may be connected to the flexible circuit 444 by die bonding or by any other suitable manner.

Figure 13B:
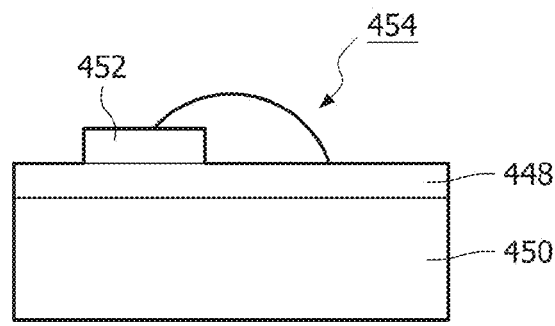

FIG. 13B illustrates an alternative implementation in which a flexible circuit 448 is mounted on a ceramic submount 450. An LED 452 may then be die bonded to the flexible circuit 448 or directly to the ceramic submount, and may be wire bonded to the flexible circuit 448 by one or more wire bonds 454 to form an electrical interconnection. Then, the ceramic submount 450 may be inductively soldered to a heat sink, such as heat sink 130, or to a thermal connector, such as thermal connector 190. Other configurations are also possible.

According to one embodiment, a temperature sensor is provided in the luminaire 100A, to enable measurement of the operating temperature of the luminaire and to facilitate control of the luminaire. The temperature sensor 416 is shown in FIG. 10A and may be mounted within an opening, or recess, in the heat sink 130, may be mounted proximate to the heat sink 130, may be disposed within a recess of the thermal connector 190, may be within the LED module 150, or may be mounted in any other suitable position to enable determination of the temperature of the luminaire 100A. The temperature sensor 416 may be connected to the power supply and control electronics 414 to provide electrical connection to the temperature sensor.

Figure 14:
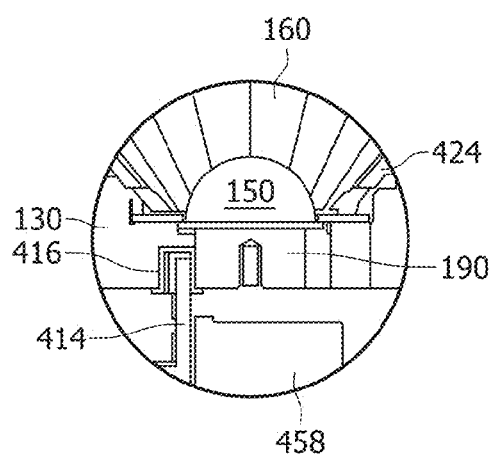
FIG. 14 illustrates a close-up view of various components of the luminaire of FIG. 10A.

FIGS. 10A and 14 illustrate one non-limiting example of the positioning of a temperature sensor in the luminaire 100A. As shown in FIG. 10A, the temperature sensor 416 may be positioned proximate to or on a tab 456 of the circuit board 175 holding various components 180 of the power supply and control electronics 414, for example, next to an electric component 458. FIG. 14 illustrates a close-up view of the heatsink 130, temperature sensor 416, power supply and control electronics 414, thermal connector 190, LED module 150, and ring-shaped circuit board 424 when assembled.

As shown in FIG. 14, the temperature sensor 416 may be mounted on the circuit board for the power supply and control electronics 414, and then may be inserted into a recess in the heatsink 130. The temperature sensor may be secured within the recess of the heatsink 130 by epoxy, or any other suitable method. Thus, according to one embodiment a printed circuit board holding power and control electronics includes a tab which is inserted into a recess of the heatsink 130. The temperature sensor 416 may be disposed on the tab of the circuit board inserted into the heatsink. It should be appreciated, however, that other configurations are possible. For example, the temperature sensor 416 need not be on the same printed circuit board as that holding the power supply and control electronics 414, but rather may be distinct. In addition, it should be appreciated that the temperature sensor 416 may be any suitable type of temperature sensor, such as a thermister, or any other type of temperature sensor.

Figure 15:
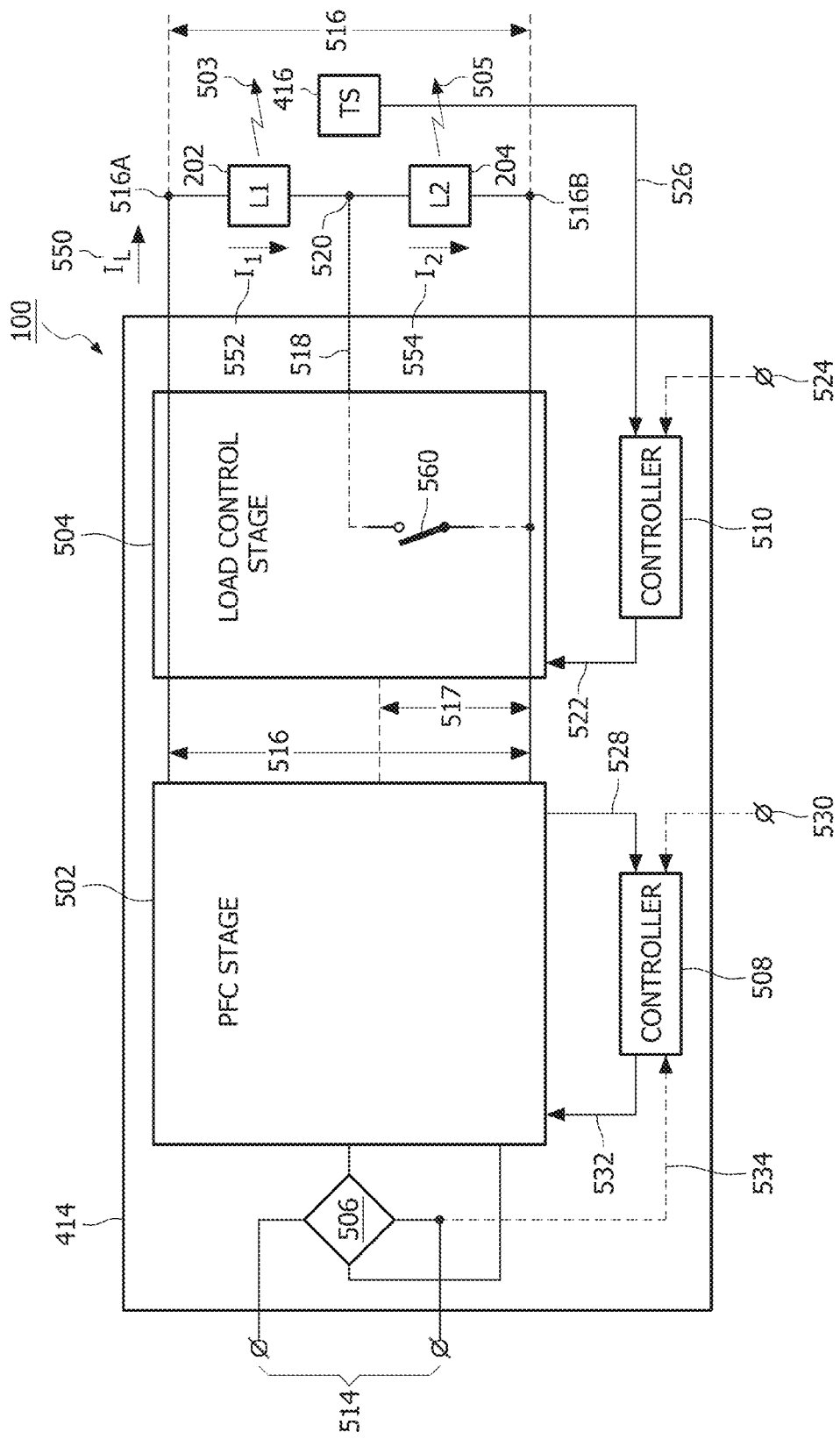
FIG. 15 is a generalized block diagram illustrating various electrical components of a power supply for multiple series-connected loads, according to one implementation of the present invention.

FIG. 15 is a generalized block diagram illustrating various electrical components of the luminaire 100 discussed above in connection with various figures, comprising multiple series-connected LED loads to provide colored and/or white light having a variety of colors and/or correlated color temperatures. It should be appreciated that some of the electrical components illustrated in FIG. 15 are optional, and that not all components need necessarily be present in various inventive embodiments of methods and apparatus according to the present disclosure.

As shown in FIG. 15, the luminaire 100 including multiple LED light sources includes a power supply and control electronics 414 that receives an A.C. input voltage 514 and provides an operating voltage 516 for the LED light sources. In FIG. 15, two different types of LED light sources are shown constituting multiple series-connected loads, namely, one or more first LEDs 202 for generating first radiation 503 having a first spectrum, and one or more second LEDs 204 for generating second radiation 505 having a second spectrum different from the first spectrum (for simplicity in FIG. 15, the one or more first LEDs are shown in a block labeled L1 and the one or more second LEDs are shown in a block labeled L2).

In one non-limiting exemplary implementation, the first LED(s) 202 may include one or more red LEDs for generating a first spectrum of radiation including essentially monochromatic red light, and the second LED(s) may include one or more white LEDs (e.g., a blue LED irradiating a phosphor) for generating a second spectrum of radiation including relatively broadband white light. Light generated by the luminaire results from a mixture of the first radiation 503 and the second radiation 505 when both are present. In one specific example, a relatively smaller number of red LEDs (e.g., six) are employed with a relatively larger number of white LEDs (e.g., twenty) in the luminaire to provide a particular correlated color temperature of white light (e.g., approximately 2800 to 3000 Kelvin) and a relatively high color rendering index (e.g., CRI of approximately 85-90).

In FIG. 15, the first LED(s) 202 and the second LED(s) 204 are electrically connected in series between a first node 516A and a second node 516B. When the power supply 414 provides the operating voltage 516, a series current 550 (IL) flows between the first node and the second node.

As shown in the block diagram of FIG. 15, the power supply 414 may be a multi-stage switching power supply for providing both power factor correction and the operating voltage 516. More specifically, the power supply 414 may include a power factor correction stage 502 for receiving the A.C. input voltage 514 via a bridge rectifier 506 and providing the power factor correction and the operating voltage 516. Due to the high power factor correction provided by the power factor correction stage 502, the luminaire/apparatus 100 appears as an essentially resistive element to the applied input voltage 514.

The power supply 414 may also include a load control stage 504 to control a flow of the series current 550 between the nodes 516A and 516B. In particular, as illustrated in FIG. 15, the load control stage 504 includes a controllable current path 518 (including switch 560), coupled to a node 520 between the first LED(s) 202 and the second LED(s) 204 and connected in parallel with the second LED(s) 204, so as to at least partially divert the series current 550 around the second LED(s) 204. In one aspect, the current path 518 may be controlled such that a first current 552 ($I_1$) through the first LED(s) and a second current 554 ($I_2$) through the second LED(s) are different. Such control of the respective currents $I_1$ and $I_2$ through the first LED(s) and the second LED(s) facilitates setting and adjusting a color or color temperature of the light generated by the luminaire. In one aspect of an exemplary implementation discussed in detail below, a portion of the second current that is diverted from the second LED(s) may be "recycled" and added to the first current.

While FIG. 15 specifically illustrates the controllable current path 518 of the load control stage 504 in parallel with the second LED(s), it should be nonetheless appreciated that one or more controllable current paths may be employed in the load control stage 504, parallel to either or both of the first LED(s) 202 and the second LED(s) 204, for diverting at least a portion of the series current 550 around either or both of the first LED(s) and the second LED(s). As also shown in FIG. 15, the load control stage 504 may receive from the power factor correction stage 502 a voltage 517 different than the operating voltage 516 for facilitating control of the switch 560 in the controllable current path 518 as well as other components in the load control stage 504, as discussed further below.

In another aspect of the embodiment shown in FIG. 15, the apparatus/luminaire 100 may further include one or more temperature sensors 416 (TS) disposed proximate to and in thermal communication with the first LED(s) 202 and the second LED(s) 204. Additionally, the power supply 414 may include a controller 510, associated with at least the load control stage 504, for receiving a temperature signal 526 provided by the temperature sensor(s) 416. As also shown in FIG. 15, the controller 510 may receive one or more external signals 524 instead of or in addition to the temperature signal 526. In one aspect, the controller 510 provides a control signal 522 to the load control stage 504 for controlling the controllable current path 518 (i.e., controlling the switch 560), based at least in part on the temperature signal 526 and/or the external signal 524. In this manner, control over one or both of the first current 552 (through the first LED(s) 202) and the second current 554 (through the second LED(s) 204) may be a function of temperature changes over time in the vicinity of the LED sources (via the temperature signal 526), and/or any number of external parameters (via the external signal 524). As discussed in greater detail below in connection with FIG. 19, the ability to vary one or both of the first and second currents as a function of LED temperature significantly mitigates undesirable variations in color or color temperature of light provided by the luminaire during thermal transients (e.g., as the LEDs warm-up over some period of time to a thermal steady state following power-on of the luminaire).

In yet another aspect of the embodiment shown in FIG. 15, the power supply 414 may include a second controller 508 coupled to the power factor correction stage 502. The controller 508 provides a control signal 532 to the power factor correction stage 502 so as to control the operating voltage 516 and/or a power provided by the power factor correction stage based on any of a variety of parameters. To this end, the controller 508 may receive as inputs a first signal 528 representing at least one voltage or current associated with the power factor correction stage 502, a second signal 534 representing a frequency of the A.C. input voltage 514, or an external signal 530. In particular, internal timing of the controller 508 may be "line-driven" via the second signal 534 (allowing accurate timing features through the use of a 50 Hz or 60 Hz A.C. line voltage reference).

It should be appreciated that while both a controller 508 associated with the power factor correction stage 502 and a controller 510 associated with the load control stage 504 are shown in the power supply 414 of FIG. 15, one or both of the controllers 508 and 510 constitute optional features that need not be present in various implementations of the apparatus/luminaire 100 according to the present disclosure. Additionally, in some inventive embodiments, a single controller may be employed to provide one or more control signals to both the power factor correction stage 502 and the load control stage 504 so as to implement the various functionalities discussed herein in connection with these respective stages.

FIG. 16 is a circuit diagram illustrating details of the power factor correction stage 502 of the power supply 414 shown in FIG. 15, according to one embodiment of the present invention. The general architecture of the circuit shown in FIG. 16 is based on the integrated circuit power factor correction controller 602 (U1), and various circuits based on this general architecture are discussed in detail in U.S. non-provisional application Ser. No. 12/113,320, filed May 1, 2008, entitled "High Power Factor LED-based Lighting Apparatus and Methods," which application is hereby incorporated herein by reference.

More specifically, the power factor correction stage 502 employs a power factor correction controller 602 exemplified by the ST Microelectronics L6562 controller. In some conventional applications, the L6562 controller and the related ST Microelectronics L6561 controller utilize a "transition mode" (TM) technique (i.e., operating around a boundary between continuous and discontinuous modes) commonly employed for power factor correction in relatively low power applications. Details of the L6561 controller and the transition mode technique are discussed in ST Microelectronics Application Note AN966, "L6561 Enhanced Transition Mode Power Factor Corrector," by Claudio Adragna, March 2003, available at http://www.st.com and incorporated herein by reference. Differences between the L6561 and L6562 controllers are discussed in ST Microelectronics Application Note AN1757, "Switching from the L6561 to the L6562," by Luca Salati, April 2004, also available at http://www.st.com and incorporated herein by reference. For purposes of the present disclosure, these two controllers generally are discussed as having similar functionality.

In addition to facilitating power factor correction, the ST Microelectronics L6561 and L6562 controllers may be alternatively employed in a "non-standard" configuration as a controller in a flyback DC-DC converter implementation. Details of this and related alternative applications of the L6561/L6562 controllers are discussed in ST Microelectronics Application Note AN1060, "Flyback Converters with the L6561 PFC Controller," by C. Adragna and G. Garravarik, January 2003, ST Microelectronics Application Note AN1059, "Design Equations of High-Power-Factor Flyback Converters based on the L6561," by Claudio Adragna, September 2003, and ST Microelectronics Application Note AN1007, "L6561-based Switcher Replaces Mag Amps in Silver Boxes," by Claudio Adragna, October 2003, each of which is available at http://www.st.com and incorporated herein by reference.

Specifically, Application Notes AN1059 and AN1060 discuss one exemplary configuration for an L6561-based flyback converter (High-PF flyback configuration) that operates in transition mode and exploits the aptitude of the L6561 controller for performing power factor correction, thereby providing a high power factor single switching stage DC-DC converter for relatively low load power requirements (e.g., up to approximately 30 Watts). The flyback converter configuration requires a voltage regulation feedback control loop, which receives as an input a sample of the DC output voltage provided by the converter and provides as feedback an error signal which is applied to the INV input of the L6561 controller.

ST Microelectronics Application Note AN1792, entitled "Design of Fixed-Off-Time-Controlled PFC Pre-regulators with the L6562," by Claudio Andragna, November 2003, available at http://www.st.com and incorporated herein by reference, discloses another approach for controlling a power factor corrector pre-regulator as an alternative to the transition mode method and the fixed frequency continuous conduction mode method. Specifically, a "fixed-off-time" (FOT) control method may be employed with the L6562 controller, for example, in which only the on-time of a pulse width modulated signal is modulated, and the off-time is kept constant (leading to a modulation in switching frequency). Like the transition mode approach, the fixed-off-time (FOT) control method conventionally contemplated using the L6562 controller similarly requires a voltage regulation feedback control loop.

As can be seen from FIG. 16, unlike the conventional applications for the L6561 and L6562 controller discussed above, the power factor correction stage 502 does not require any feedback control loop to regulate the operating voltage 516, thereby simplifying the circuit design as compared to conventional implementations. In particular, Applicants have recognized and appreciated that for implementations involving essentially fixed/stable load power requirements, a voltage regulation feedback control loop is not necessary to achieve effective operation. Specifically, loads involving light emitting diodes (LEDs) themselves are essentially voltage regulation devices, in that a single LED or multiple LEDs interconnected in various series, parallel, or series/parallel configurations dictates a particular voltage across the load. Hence, the power factor correction stage 502 may be reliably configured to provide an appropriately stable operating voltage 516 and power to the LED load without requiring a feedback control loop.

In the circuit diagram of FIG. 16, the power factor correction stage 502 is based on a buck type DC-DC converter configuration, in which the power factor correction controller 602 controls a switch 604 (implemented by transistor Q1) which in turn dictates an energy storage and release cycle for an inductor (provided by one of the windings of transformer T1). More specifically, during the intervals in which the transistor switch 604 is "on" or closed (i.e., applying a voltage across the transformer winding serving as the inductor), current flows through the inductor based on the applied voltage and the inductor stores energy in its magnetic field. When the switch is turned "off" or opened (i.e., voltage is removed from the inductor), the energy stored in the inductor is transferred via diode D9 to a filter capacitor C7, across which is provided the operating voltage 516 (i.e., the capacitor provides essentially continuous energy between inductor energy storage cycles).

The power factor correction stage 502 may be configured for a variety of different input voltages 514, operating voltages 516, and load series current 550 ($I_L$) based on an appropriate selection of various circuit components. In particular, the resistor divider network 606 formed by R10 and R11 substantially determines the series current 550 through the load, given that the type and number of series-connected LEDs constituting the load essentially determines the target operating voltage. In the particular circuit example shown in FIG. 16, the circuit is configured to accept an input voltage of 120 Volts RMS, and provide an operating voltage on the order of 80 Volts with a series current 550 on the order of 150 milliamperes. In one aspect of the circuit shown in FIG. 16, the power factor correction controller 602 is configured to employ the fixed-off time (FOT) control technique to control the switch 604 (Q1). The FOT control technique permits the use of a relatively smaller transformer T1 for the buck configuration. This allows the transformer to be operated at a more constant frequency, which in turn delivers higher power to the load for a given core size.

In some exemplary implementations, the A.C. input voltage 514 may be derived from an output of an A.C. dimmer (which in turn receives as an input an A.C. line voltage). In various aspects, the voltage 514 provided by the A.C. dimmer may be a voltage amplitude controlled or duty-cycle (phase) controlled A.C. voltage, for example. In one exemplary implementation, by varying an RMS value of the A.C. voltage 514 applied to the power supply 414 via the A.C. dimmer, the operating voltage 516 (and in turn the series current 550) may be similarly varied; thus, the A.C. dimmer may be employed to vary an overall brightness of light generated by the luminaire.

FIG. 17 is a circuit diagram illustrating the power factor correction stage 502 of the power supply 414 shown in FIG. 15, together with an associated controller 508, according to another embodiment of the present invention. The power factor correction stage 502 shown in FIG. 17 is substantially similar to the one shown in FIG. 16 in many salient respects, although some particular component values may be different to illustrate the possibility of different operating parameters (e.g., input voltage, operating voltage, current). As discussed above in connection with FIG. 15, an optional controller 508 may be employed in association with the power factor correction stage 502 to provide a control signal 532, applied to the resistor divider network 606, so as to control the operating voltage 516 and/or series current 550, and thus the power, provided by the power factor correction stage. The controller 508 may generate the control signal 532 based on any one of a variety of parameters provided as inputs to the controller 508. As discussed further below in connection with FIG. 19, in one exemplary implementation the control signal 532 provided by the controller 508 may be a pulse-width modulated (PWM) control signal, the duty cycle of which affects the voltages established by the resistor divider network 606; hence, by varying the duty cycle of a PWM control signal 532, the operating voltage 516 and/or the series current 550 provided by the power factor correction stage 502 may be varied by the controller 508.

With respect to parameters in response to which the controller 508 may vary the control signal 532, as shown in FIG. 17 the controller 508 may receive one or more inputs 528 representing at least one voltage or current associated with the power factor correction stage 502 (e.g., pin 6 of the IC U3 is coupled to receive the signal controlling the switch Q1, and pins 2 and 3 of U3 are coupled to a voltage associated with the resistor divider network 606). In this manner, the controller 508 may serve a feedback control function and provide the control signal 532 in response to any one of a number of monitored circuit parameters associated with the power factor correction stage 502.

The controller 508 also may receive a signal 534 representing a frequency of the A.C. input voltage 514 (applied to pin 7 of IC U3 via the resistor divider network formed by R15, R18 and R19). In particular, internal timing of the controller 508 may be "line-driven" via the signal 534, allowing accurate timing features through the use of a 50 Hz or 60 Hz A.C. line voltage reference. In one exemplary application, the controller 508 may maintain a cycle count (e.g. monitor zero-crossings) of the A.C. input voltage 514 via the signal 534 as a metric for "time in operation" of the LED light sources constituting the load. In turn, the controller 508 may adjust operating parameters of the power factor correction stage via the control signal 532 based on the time of operation to compensate for aging effects associated with LEDs (e.g., increasing the operating voltage 516 and/or the series current 550 to compensate for lower efficiency/reduced flux of aging LEDs). Alternatively or in addition to adjusting operating parameters of the power factor correction stage to compensate for aging effects, the controller 508 may use the information associated with "time in operation" of the LED light sources to provide some indication of "lamp life remaining." For example, the controller 508 may provide a control signal 532 that modulates the power provided to the LED load to visibly affect the generated light (e.g., intentionally blink or modulate light brightness) so as to provide information relating to some condition (e.g., lamp age) via the intentionally modulated light.

Additionally, the controller 508 may receive one or more external signals 530 (e.g., applied to pin 5 of IC U3 in the example of FIG. 17) so that control of the power factor correction stage 502 may be based on any of a wide variety of external conditions (e.g., temperature conditions, ambient lighting conditions, other environmental conditions, over-voltage or load failure conditions, emergency conditions, motion, etc.). In response to one or more such external signals, the controller may provide a control signal 532 that adjusts one or more operating parameters of the power factor correction stage, and/or may modulate the power provided to the LED load so as to provide information relating to some condition represented by the external signal(s) via the intentionally modulated light.

FIG. 18 is a circuit diagram illustrating details of the load control stage 504 of the power supply 414 shown in FIG. 15, according to one embodiment of the present invention. Similar to the power factor correction stage 502, the general circuit architecture for the load control stage 504 shown in FIG. 18 is based on the ST Microelectronics L6562 integrated circuit controller, shown as IC U4, utilizing a fixed-off time (FOT) control technique and implemented in a buck converter configuration. In particular, the IC controller 562 constituted by U4 controls the switch 560 (implemented by transistor Q6) to in turn control the current path 518, in which also is disposed the inductor L3 as the energy storage/release device in the buck converter configuration.

As discussed above in connection with FIG. 15, in FIG. 18 the first LED(s) 202 and the second LED(s) 204 are connected in series between the nodes 516A and 516B, across which the operating voltage 516 is provided. The controllable current path 518 is coupled to the node 520 between the series-connected first LED(s) 202 and second LED(s) 204. While only a single LED is shown for purposes of illustration in FIG. 18 for each of the series-connected LED loads, as discussed above it should be appreciated that each of the LED loads 202 and 204 may include multiple LED light sources, connected in any of a variety of series, parallel, or series parallel arrangements, and may have different numbers of a given type of LED. In one exemplary implementation discussed herein, the first LED(s) 202 may include on the order of six series-connected red LEDs and the second LED(s) 204 may include on the order of 20 series-connected white LEDs. Given a forward operating voltage for a red LED on the order of 3.3 Volts, and a forward operating voltage for a white LED on the order of 3 Volts, an appropriate operating voltage 516 applied across the nodes 516A and 516B in this example would be on the order of 80 Volts (i.e., [3.3 Volts×6]+[3 Volts×20]).

Via control of the switch 560 and in turn the current path 518, the load control stage 504 of FIG. 18 controls a flow of the series current 550 between the nodes 516A and 516B. In particular, via operation of the switch 560, the series current 550 may be at least partially diverted around the second LED(s) 204, such that the first current 552 ($I_1$) through the first LED(s) and the second current 554 ($I_2$) through the second LED(s) are different; specifically, when the switch 560 is "on" or conducting, the inductor L3 is connected to a ground potential via resistor R38, thereby providing an alternate current path between the nodes 516A and 516B and allowing at least some of the series current 550 to be diverted around the second LED(s) 204. In the circuit of FIG. 18, a duty cycle of the switch 560 as controlled by the IC controller 562, and hence the difference between the first current 552 and the second current 554, is set by the resistor divider network 652 constituted by R41 and R16. In the particular example illustrated in FIG. 18, with R41 at 10 K-Ohms and R16 at 20 K-Ohms, and based on an operating voltage 516 of approximately 80 Volts and a series current 550 of approximately 150 milliamperes, the first current 552 is on the order of 180 milliamperes and the second current 554 is on the order of 120 milliamperes. The foregoing illustrates that the portion of the series current that is diverted from the second LED(s) is not lost, but recycled, in that it is diverted to the storage element (inductor L3) and dumped (on the next half of the cycle) back into the first LED(s), with minimal losses (e.g., 30 milliamperes is deducted from the second current and added to the first current).

The first current 552 and the second current 554 generally determine respective amounts (luminous flux) of the first radiation 503 and the second radiation 505 generated by the first LED(s) and the second LED(s). Accordingly, by appropriate selection of the values of resistors R41 and R16 in FIG. 18, and based on the type and number of LEDs employed for each of the first LED(s) 202 and the second LED(s) 204, a color or color temperature of generated light (based on a mixture of the first radiation and the second radiation) may be set.

Notwithstanding the foregoing, Applicants have recognized and appreciated that the current-to-flux relationship for different types of LEDs varies differently as a function of temperature. This phenomenon may be problematic for some applications involving multiple different types of LEDs in which thermal transients are expected. For example, a system initially at some ambient temperature that is then powered-up for operation "warms-up" over some thermal transient period during which current begins and continues to flow through the LEDs. Based on an illustrative implementation involving both red LEDs and white LEDs for the respective series-connected loads, as the system continues to warm-up to some thermal steady state, the flux from the red LED(s) changes at a different rate than the flux from the white LED(s) as a function of temperature, causing a noticeable shift in the color temperature of generated light during the thermal transient period; more specifically, at constant respective values for the first and second currents, as the system warms-up the flux from the red LED(s) decreases at a rate faster than the flux from the white LED(s). By way of example, over an approximately twenty minute thermal transient period following initial power-up, the color temperature of generated light may shift (e.g., increase) by as much as 100 Kelvin, due to a decrease in the flux from the red LED(s) as compared to the white LED(s). For some applications this effect is undesirable, especially at lower nominal color temperatures at which the human eye is more sensitive to color shifts.

In view of the foregoing, another embodiment of the present invention is directed to methods and apparatus for compensating color and/or color temperature shifts arising from thermal transients in a lighting apparatus that includes multiple series-connected LED light sources of different types.

To this end, FIG. 19 is a circuit diagram illustrating the load control stage 504 of the power supply shown in FIG. 15, together with an associated controller 510, according to another embodiment of the present invention. In one aspect of this embodiment, the controller 510 controls the load control stage 504 in response to a temperature signal 526 received from a temperature sensor 416 disposed proximate to and in thermal communication with the first LED(s) 202 and the second LED(s) 204, so as to provide the thermal compensation functionality noted above. It should be appreciated, however, that this thermal compensation functionality constitutes merely one example of how the controller 510 may be implemented to control various aspects of the load control stage 504, and that parameters or conditions other than the temperature proximate to the LED light sources may be input to and utilized by the controller 510 to affect control of the load control stage 504 (e.g., refer to the discussion above in connection with the external signal 524 shown in FIG. 15).

As shown in FIG. 19, in one exemplary implementation the controller 510 includes an integrated circuit microcontroller U3 that receives operating power from an integrated circuit voltage regulator U2. With respect to compensation for thermal transients, the microcontroller U3 also receives as an input the temperature signal 526 output by the temperature sensor 416 (U5), and provides as an output a control signal 522 that is applied to resistor network/filter 652 of the load control stage 504. In one exemplary implementation, the temperature sensor 416 may be a low-power linear active thermistor integrated circuit, examples of which include the MCP9700/9700A and MCP9701/9701A family of integrated circuits available from Microchip Technology, Inc.

In one exemplary implementation the controller 510 may provide the control signal 522 to the load control stage 504 in the form of a pulse width modulated (PWM) control signal, the duty cycle of which affects the voltages established by the resistor network/filter 652 of the load control stage 504. Hence, by varying the duty cycle of a PWM control signal 522, the controller 510 may in turn vary a difference between the first current 552 through the first LED(s) 202 and the second current 554 through the second LED(s) 204 and thereby alter the respective fluxes generated by the different LED types. By controlling the duty cycle of the PWM control signal 522 in response to the temperature signal 526, the controller 510 may effectively provide compensation for shifts in color or color temperature of generated light during thermal transients (e.g., due to different temperature-dependent current-to-flux relationships for different types of LEDs).

Figure 20:
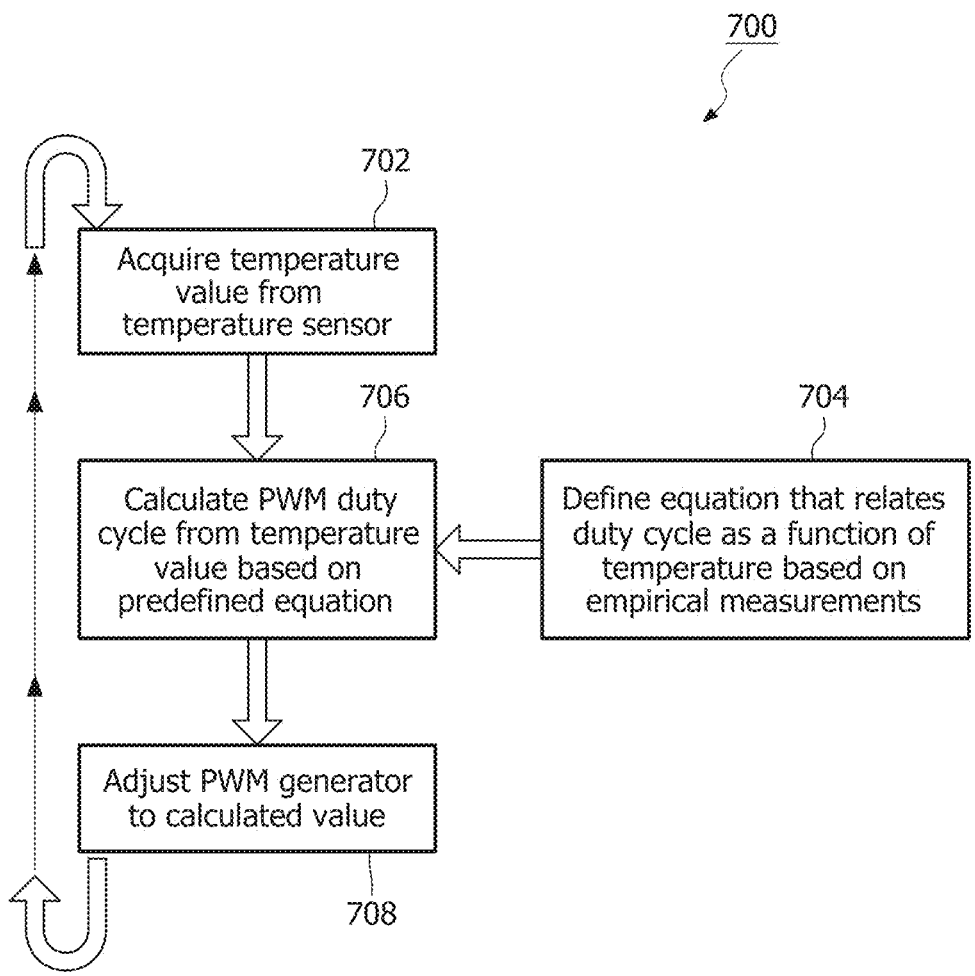
FIG. 20 illustrates a flow diagram showing a temperature compensation method implemented by the controller of FIG. 19 for controlling the load control stage, according to one implementation of the present invention.

FIG. 20 illustrates a flow diagram showing a method 700 implemented by the controller 510 for adjusting a duty cycle of the PWM control signal 522 in response to temperature variations represented by the temperature signal 526, according to one embodiment of the present invention. In one aspect of the method 700, as indicated in block 704, a relationship (e.g., equation) is defined a priori that relates the duty cycle of the PWM control signal 522 to temperature variations represented by the temperature signal 526. Once such a relationship is defined, as illustrated in FIG. 20, the controller 510 acquires (block 702) a temperature value from the temperature sensor 416, as represented by the temperature signal 526, and calculates (block 706) the duty cycle as a function of measured temperature based on the predefined relationship/equation (block 704). The controller 510 then adjusts the duty cycle of the PWM control signal 522 to the newly calculated value (block 708), and the method returns to the block 702 for reiteration.

With respect to the relationship in block 704 that specifies duty cycle as a function of temperature for the PWM control signal 522, this relationship may be empirically determined during a calibration procedure, an example of which is discussed in detail below. Such a relationship may be modeled as a linear, piece-wise linear, or nonlinear relationship, depending at least in part on the degree of compensation desired for a given application. In one exemplary model, the relationship is dictated by a linear equation (in which various parameters of the equation are determined empirically), given by:

$$PWM \text{ Duty Cycle} = [\text{Ambient Temp Duty Cycle}] - [(\text{Temp Reading}) - \text{Ambient Temp})]*[\text{Slope}] \quad (\text{Eq. 1})$$

In Eq. 1, "PWM Duty Cycle" refers to the duty cycle of the control signal 522 calculated in block 706 of FIG. 20, the "Ambient Temp Duty Cycle" is the duty cycle of the control signal 522 at which the first and second currents provide a desired target color temperature for the generated light when the LEDs 202 and 204 are at ambient temperature, the "Temp Reading" is the temperature represented by the temperature signal 526 (as acquired in block 702 of FIG. 20), the "Ambient Temp" is the ambient temperature (e.g., prior to power-on), and the "Slope" is the change in duty cycle per change in temperature.

In one exemplary implementation, all of the values represented in Eq. (1) are converted to a binary value between 0 and 255 (so that they each may be processed by the microcontroller U3 of the controller 510 as an 8-bit data word). With respect to the duty cycle values, a binary value of 255 represents 100% (i.e., a binary value of 128 represents an approximately 50% duty cycle). With respect to the "Temp Reading" and "Ambient Temp" parameters, in one example temperature in degrees Celsius is converted according to: floor([(Temperature [° C.]*0.01+0.414)/5]*255).

In an exemplary calibration procedure to facilitate determination of the various parameters of Eq. (1), one aspect of the procedure involves varying the duty cycle of the PWM control signal 522 over some exemplary range and measuring the first current 552 and the second current 554. Table 1 below provides and example of such measurements.

TABLE 1

| Duty Cycle (%) | First Current (mA) | Second Current (mA) |
| --- | --- | --- |
| 12.5 | 177 | 122 |
| 25 | 168 | 124 |
| 50 | 155 | 128 |
| 62.5 | 150 | 130 |
| 75 | 145 | 130 |

Another aspect of the calibration procedure involves measuring the color temperature of generated light as a function of various first and second currents applied to the respective first and second LEDs. This process involves a sequence of "instant-on" photometric tests, in which two separate known current sources are respectively connected to the first LED(s) and the second (LEDs) for a relatively short period of time and the color temperature of generated light is measured within a few seconds of the currents being applied. The currents are then immediately turned off long enough so that the LEDs are maintained at an ambient thermal steady state before applying another pair of currents. In one exemplary implementation in which red LED(s) are employed as the first LED(s) and white LED(s) are employed as the second LED(s), it may be assumed that the red flux varies more than the white flux, and hence a nominal value may be chosen for the second current while the first current is varied. Table 2 below provides one example of such a measurement process.

TABLE 2

| Second (white) Current (mA) | First (red) Current (mA) | Correlated Color Temperature (° K) |
| --- | --- | --- |
| 130 | 150 | 2994 |
| 130 | 160 | 2853 |
| 130 | 170 | 2175 |
| 130 | 180 | 2777 |

Based on the measurement process exemplified in Table 2, a nominal target operating color temperature may be selected for the generated light. Based on this target color temperature, the corresponding first and second currents required (from Table 2) are matched to similar first and second currents in Table 1 to determine the "Ambient Temp Duty Cycle" for Eq. (1). For example, if the target color temperature is 3000 Kelvin, from Table 2 this corresponds to a first current of 150 mA and a second current of 130 mA at ambient temperature, which from Table 1 in turn corresponds to a duty cycle for the PWM control signal 522 of 62.5%. Thus, the "Ambient Temp Duty Cycle" in this example for Eq. (1) would have a binary value of 62.5% (255)=159.

A final aspect of the calibration procedure to facilitate determination of the various parameters in Eq. (1) involves a determination of the "Slope" term. Again, the "Slope" term represents the change in duty cycle per change in temperature required to maintain a sufficiently stable color and/or color temperature of generated light during a thermal transient such as a warm-up period following power-on. In one example, a determination of an appropriate slope term may include choosing an initial seed value for the "Slope" term, iterating the method 700 over an estimated thermal transient period (e.g., twenty to thirty minutes), making periodic measurements (e.g., every thirty seconds) of the color temperature of generated light, and plotting these color temperature measurements vs. time. This process may be repeated using a different value for the "Slope" term until an appropriate value is found that results in the flattest color temperature vs. time plot.

Figure 21:
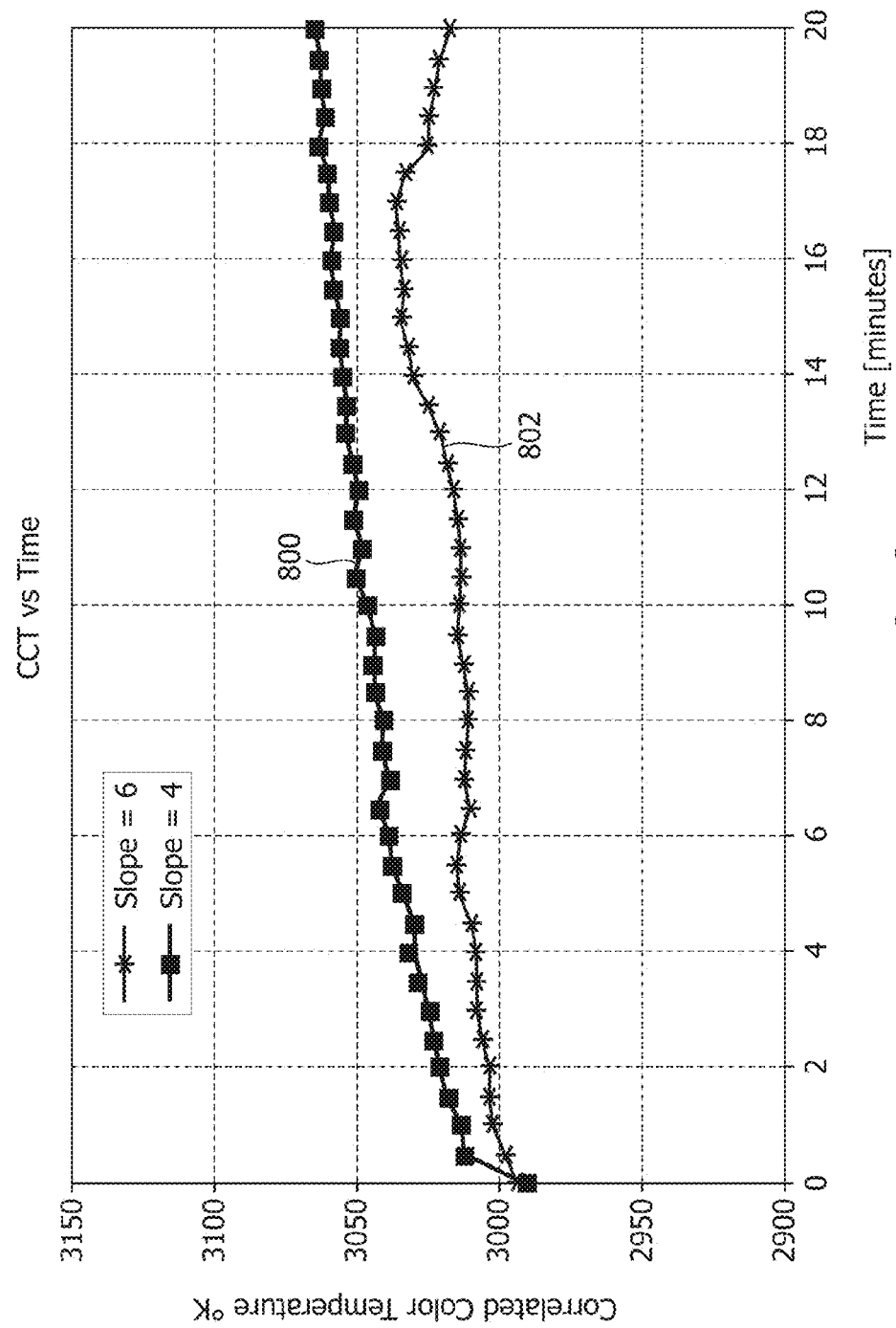
FIG. 21 illustrates two plots of color temperature of generated light vs. time based on the temperature compensation method of FIG. 20, according to one implementation of the present invention.

FIG. 21 provides two such exemplary plots based on an "Ambient Temp Duty Cycle" binary value of 159 (representing a target color temperature of 3000 Kelvin), and an "Ambient Temp" binary value of 38 (representing an ambient temperature of 25 degrees Celsius). A first plot 800 is generated using a "Slope" term having a binary value of 4 and a second plot 802 is generated using a "Slope" term having a binary value of 6. From FIG. 21, it may be readily observed that, in this example, a "Slope" term having a binary value of 6 results in a significantly flatter color temperature vs. time plot during the thermal transient period. Thus, by employing the equation:

$$PWM \text{ Duty Cycle} = [159] - [(\text{Temp Reading}) - 38)]*[6]$$

in block 704 of the method 700 shown in FIG. 20, for this particular example the controller 510 implementing the method 700 effectively compensates for the thermal transient and provides a stable color temperature of approximately 3000 Kelvin throughout the thermal transient (e.g., "warm-up") period.

It should be appreciated that the general outline of the foregoing calibration procedure may be applied to other types of LED sources and/or other color temperature ranges of interest to effectively implement the temperature compensation functionality of the controller 510 shown in FIG. 19. In particular, it should be appreciated that in some instances, using exactly the same hardware, two identical luminaires may be configured to provide significantly different colors and/or color temperatures of white light merely by selecting a different value for the "Ambient Temp Duty Cycle" term in Eq. (1) above. Additionally, the "Ambient Temp Duty Cycle" term in Eq. (1) may in some implementations be a predetermined function of time (e.g., to compensate for gradual aging of the LEDs and flux depreciation over time). Furthermore, as noted above, the particular relationship employed in block 704 of the method 700 shown in FIG. 20 may be modeled as a linear relationship as in Eq. (1) above, or alternatively as a piece-wise linear or nonlinear relationship, depending at least in part on the degree of compensation desired for a given application).

Figure 22:
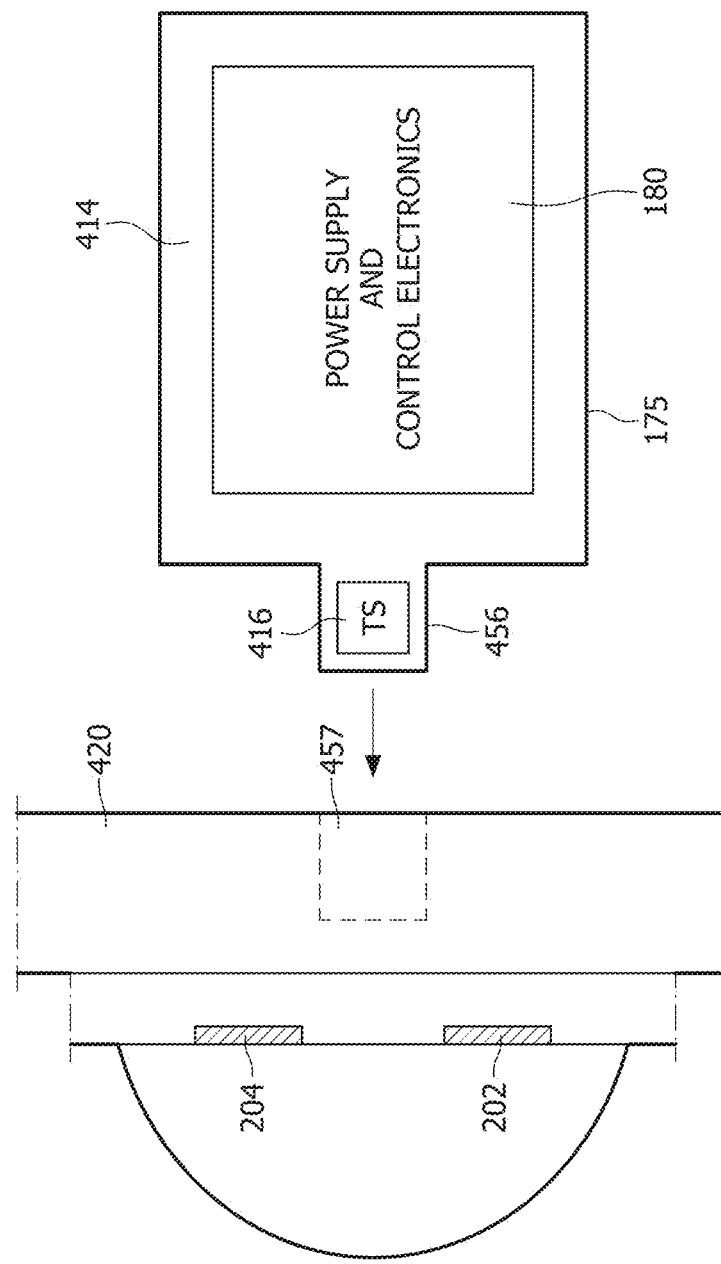
FIG. 22 illustrates an exemplary configuration of a printed circuit board on which is disposed the power supply of FIG. 15, and a coupling of the printed circuit board to a substrate carrying LED loads, according to one implementation of the invention.

FIG. 22 illustrates an exemplary configuration of a printed circuit board 175 on which is disposed a plurality of components 180 constituting the power supply 414, together with the temperature sensor 416, according to one embodiment of the invention. FIG. 22 also shows a substrate 420 (e.g., the heat sink shown in earlier figures) carrying the first LED(s) 202 and the second LED(s) 204. The arrangement shown in FIG. 22 facilitates a thermal connection between the temperature sensor 416 and the LEDs, and therefore efficient tracking of the LED temperature (e.g., for purposes of providing color and/or color temperature stability during a thermal transient). In particular, the first LED(s) 202 and the second LED(s) 204 are mounted to a thermally conductive substrate 420, which has a recess 457 formed therein, proximate to the LED(s) 202 and 204. The printed circuit board 175 has a tab 456 for insertion into the recess 457; to this end, although the particular view of FIG. 22 illustrates a primarily rectangular tab and rectangular recess, it should be appreciated that the tab 456 may have any of a variety of shapes and dimensions, with the recess 457 being complimentarily formed so as to accommodate the tab. The temperature sensor 416 is disposed on the tab of the printed circuit board, such that when the printed circuit board 175 is inserted into the recess 457, the temperature sensor is essentially embedded in the thermally conductive substrate proximate to the LEDs. As discussed above in connection with FIGS. 15-19, the power supply 414 may include multiple stages based on multiple transition mode controllers, and a plurality of circuit components constituting the power supply 414 may be appropriately disposed on the printed circuit board 175.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An illumination apparatus, comprising:
an LED module having at least a first die and a second die, the first die configured to produce a first spectrum of radiation and the second die configured to produce a second spectrum of radiation;
the LED module having a primary substantially dome shaped lens with a first texturing;
a parabolic secondary reflector optic having a first opening with a first diameter and a second opening with a second diameter, the first diameter less than the second diameter;
the primary substantially dome shaped lens positioned adjacent the first opening;
the secondary reflector optic having a second texturing on at least a portion of a light receiving surface of the secondary reflector optic;
a temperature sensor adjacent to the LED module;
a power converter providing power factor correction and operating voltage to the LED module, the power converter being a switching power supply which receives input from the temperature sensor to control a first current to the first die and a second current to the second die.

2. The apparatus of claim 1, wherein the primary lens comprises a hemispherical lens raised a distance (H1) above a substrate to which the first and second die are coupled.

3. The apparatus of claim 1, wherein the secondary reflector optic forms an exit aperture through which light produced by the LED module passes, and wherein there is no diffusing element across the exit aperture.

4. The apparatus of claim 1, further comprising a heat sink to which the LED-based light source is thermally coupled, and a thermal connector mounted in or on the heat sink.

5. The apparatus of claim 1, wherein the secondary reflector optic has an exit aperture, and wherein the apparatus further comprises a diffuser disposed across the exit aperture.

6. The apparatus of claim 4, further comprising an element mechanically coupled to the heat sink and having a cavity therein for receiving power circuitry for providing power to the LED module, the element configured to mate to a screw base.

7. The apparatus of claim 4, further comprising a housing formed of electrically non-conducting material, and wherein the LED module, the secondary optic, and the heat sink are disposed within the housing.

8. The apparatus of claim 4, wherein the thermal connector is a copper plug.

9. The apparatus of claim 6, further comprising the power circuitry, and a flexible circuit interconnecting the LED module and the power circuitry.

10. The apparatus of claim 7, wherein the housing defines one or more holes configured to facilitate heat dissipation.

11. The apparatus of claim 8, wherein the copper plug has a first surface raised above the heat sink, and wherein the LED module is mounted on the first surface of the copper plug.

12. The apparatus of claim 10, further comprising a cover lens coupled to the housing, wherein the cover lens and housing in combination substantially surround the LED module, the secondary reflector optic, and the heat sink.

13. The apparatus of claim 11, wherein the temperature sensor is mounted within or proximate to the heat sink and thermally coupled to the LED module.

* * * * *